(12) United States Patent
Kim et al.

(10) Patent No.: US 11,659,770 B2
(45) Date of Patent: May 23, 2023

(54) SEMICONDUCTOR DEVICE, MAGNETORESISTIVE RANDOM ACCESS MEMORY DEVICE, AND SEMICONDUCTOR CHIP INCLUDING THE SAME

(71) Applicant: SAMSUNG ELECTRONICS CO., LTD., Suwon-si (KR)

(72) Inventors: Dae-Shik Kim, Hwaseong-si (KR); Jeong-Heon Park, Hwaseong-si (KR); Gwan-Hyeob Koh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 334 days.

(21) Appl. No.: 17/004,637

(22) Filed: Aug. 27, 2020

(65) Prior Publication Data

US 2020/0395536 A1 Dec. 17, 2020

Related U.S. Application Data

(63) Continuation of application No. 16/540,146, filed on Aug. 14, 2019, now Pat. No. 10,777,737, which is a (Continued)

(30) Foreign Application Priority Data

May 26, 2017 (KR) .................. 10-2017-0065113

(51) Int. Cl.
*H01L 43/12* (2006.01)
*H01L 43/08* (2006.01)
(Continued)

(52) U.S. Cl.
CPC ............ *H01L 43/12* (2013.01); *G11C 11/161* (2013.01); *H01L 27/228* (2013.01);
(Continued)

(58) Field of Classification Search
CPC . H01L 43/12; H01L 27/228; H01L 29/41791; H01L 43/02; H01L 43/08; G11C 11/161
(Continued)

(56) References Cited

U.S. PATENT DOCUMENTS 6,928,015 B2  8/2005  Ooishi
7,372,140 B2  5/2008  Lee
(Continued)

FOREIGN PATENT DOCUMENTS

CN   106356448 A   1/2017
JP   2010-093277 A   4/2010
(Continued)

OTHER PUBLICATIONS

Chinese Office Action dated Oct. 10, 2022 for corresponding Chinese Patent Application No. 201810515747.9.

*Primary Examiner* — Jami Valentine Miller
(74) *Attorney, Agent, or Firm* — Lee IP Law, P.C.

(57) ABSTRACT

In a method of manufacturing an MRAM device, first and second lower electrodes may be formed on first and second regions, respectively, of a substrate. First and second MTJ structures having different switching current densities from each other may be formed on the first and second lower electrodes, respectively. First and second upper electrodes may be formed on the first and second MTJ structures, respectively.

20 Claims, 22 Drawing Sheets

Related U.S. Application Data continuation of application No. 15/856,256, filed on Dec. 28, 2017, now Pat. No. 10,388,859.

(51) Int. Cl.
| | | |
|---|---|---|
| *G11C 11/16* | (2006.01) | |
| *H01L 27/22* | (2006.01) | |
| *H01L 43/02* | (2006.01) | |
| *H01L 29/417* | (2006.01) | |

(52) U.S. Cl.
CPC ........ *H01L 29/41791* (2013.01); *H01L 43/02* (2013.01); *H01L 43/08* (2013.01)

(58) Field of Classification Search
USPC .............................................. 438/3; 257/421
See application file for complete search history.

(56) References Cited

U.S. PATENT DOCUMENTS

| | | | |
|---|---|---|---|
| 8,120,949 | B2 | 2/2012 | Ran et al. |
| 8,866,242 | B2 | 10/2014 | Li et al. |
| 9,041,146 | B2 | 5/2015 | Lee et al. |
| 9,099,188 | B2 | 8/2015 | Guo |
| 9,666,790 | B2 * | 5/2017 | Chuang ................. H01L 27/228 |
| 10,636,465 | B2 * | 4/2020 | Song ....................... H01L 43/10 |
| 2010/0019297 | A1 | 1/2010 | Hwang |
| 2012/0134200 | A1 | 5/2012 | Khoueir et al. |
| 2013/0107612 | A1 | 5/2013 | Zhou et al. |
| 2014/0050019 | A1 | 2/2014 | Lee et al. |
| 2015/0043272 | A1 | 2/2015 | Zhou et al. |
| 2018/0040813 | A1 * | 2/2018 | Han ....................... H01L 43/08 |

FOREIGN PATENT DOCUMENTS

| | | |
|---|---|---|
| KR | 10-2010-0010410 A | 2/2010 |
| KR | 10-2010-0094905 A | 8/2010 |

* cited by examiner

SEMICONDUCTOR DEVICE, MAGNETORESISTIVE RANDOM ACCESS MEMORY DEVICE, AND SEMICONDUCTOR CHIP INCLUDING THE SAME

CROSS-REFERENCE TO RELATED APPLICATIONS

This is a continuation of U.S. patent application Ser. No. 16/540,146 filed Aug. 14, 2019, which is a continuation of U.S. patent application Ser. No. 15/856,256, filed Dec. 28, 2017, now U.S. Pat. No. 10,388,859 B2 issued on Aug. 20, 2019, the entire contents of each which are hereby incorporated by reference.

This application claims priority under 35 USC § 119 to Korean Patent Application No. 10-2017-0065113, filed on May 26, 2017 in the Korean Intellectual Property Office (KIPO), the contents of which are herein incorporated by reference in their entirety.

BACKGROUND

1. Technical Field

Example embodiments relate to methods of manufacturing a semiconductor device and methods of manufacturing a semiconductor chip including the same. More particularly, example embodiments relate to methods of manufacturing a magnetoresistive random access memory (MRAM) device and methods of manufacturing a semiconductor chip including the same.

2. Description of Related Art

If a switching current density for changing the magnetization direction of a free layer of an MTJ is low, an MRAM device including the MTJ may have a low consumption power and a high operation speed. However, if the switching current density is high, the MRAM device may have a high data retention characteristic. It is difficult to develop an MRAM device including the low consumption power and the high operation speed, and the high data retention characteristic as well.

SUMMARY

According to example embodiments, there is provided a method of manufacturing an MRAM device. In the method, first and second lower electrodes may be formed on first and second regions, respectively, of a substrate. First and second MTJ structures having different switching current densities from each other may be formed on the first and second lower electrodes, respectively. First and second upper electrodes may be formed on the first and second MTJ structures, respectively.

According to example embodiments, there is provided a method of manufacturing an MRAM device. In the method, first and second lower electrode layers may be formed on first and second memory cell regions, respectively, of a substrate. First and second MTJ structure layers may be formed on the first and second lower electrode layers, respectively. First and second upper electrodes may be formed on the first and second MTJ structure layers, respectively. The first and second MTJ structure layers and the first and second lower electrode layers may be patterned using the first and second upper electrodes as an etching mask to form a first lower electrode, a first MTJ structure, and the first upper electrode sequentially stacked on the first memory cell region of the substrate, and a second lower electrode, a second MTJ structure, and the second upper electrode sequentially stacked on the second memory cell region of the substrate. The first and second MTJ structures may have different data retentions from each other.

According to example embodiments, there is provided a method of manufacturing a semiconductor chip. In the method, first and second lower electrodes may be formed on first and second memory cell regions, respectively, of a substrate including first and second memory block regions, a logic region, and an input/output (I/O) region. The first memory block region may include the first memory cell region and a first peripheral circuit region, and the second memory block region may include the second memory cell region and a second peripheral circuit region. First and second MTJ structures having different switching current densities from each other may be formed on the first and second lower electrodes, respectively. First and second upper electrodes may be formed on the first and second MTJ structures, respectively.

The MRAM device in accordance with example embodiments may be fabricated to have different characteristics in different regions, for example, a high data retention in one region, and a lower consumption power and a high operation speed in another region.

BRIEF DESCRIPTION OF THE DRAWINGS

Example embodiments will be more clearly understood from the following detailed description taken in conjunction with the accompanying drawings.

FIGS. 1 to 4 are cross-sectional views illustrating a method of manufacturing an MRAM device in accordance with example embodiments;

FIGS. 5 to 7 are cross-sectional views illustrating a method of manufacturing an MRAM device;

FIGS. 8 and 9 are cross-sectional views illustrating a method of manufacturing an MRAM device;

FIGS. 10 and 11 are cross-sectional views illustrating a method of manufacturing an MRAM device;

FIGS. 12 to 14 are cross-sectional views illustrating a method of manufacturing an MRAM device;

FIGS. 15 to 35 are plan views and cross-sectional views illustrating a method of manufacturing an MRAM device in accordance with example embodiments; and FIG. 36 illustrates a method of manufacturing a semiconductor chip in accordance with example embodiments.

DESCRIPTION OF EMBODIMENTS

FIGS. 1 to 4 are cross-sectional views illustrating a method of manufacturing an MRAM device in accordance with example embodiments.

Figure 1:
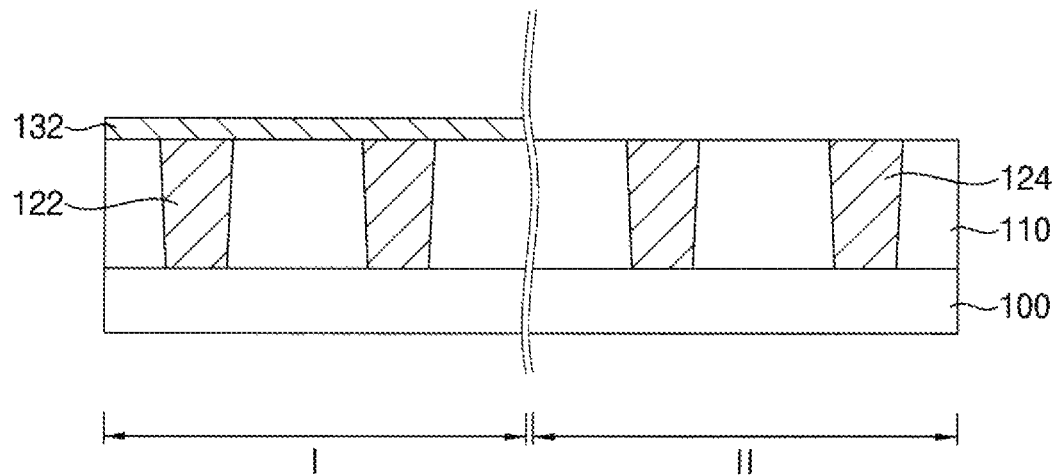
FIGS. 1 to 36 represent non-limiting, example embodiments as described herein.

Referring to FIG. 1, an insulating interlayer 110 may be formed on a substrate 100, and first and second contact plugs 122 and 124 may be formed through the insulating interlayer 110.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The substrate 100 may include first and second regions I and II. In example embodiments, each of the first and second regions I and II may serve as a memory cell region in which memory cells may be formed, and the first and second regions I and II may be distinguished from each other. For example, the first and second regions I and II may be spaced apart from each other.

Various types of elements, e.g., word lines, transistors, diodes, source/drain layers, contacts plugs, vias, wirings, etc., and an insulating interlayer covering the elements may be formed on the substrate 100. For example, the first and second contact plugs 122 and 124 may contact wirings or source/drain layers overlying or underlying the first and second contact plugs 122 and 124.

The insulating interlayer 110 may include an oxide, e.g., silicon dioxide ($SiO_2$), or a low-k dielectric material having a dielectric constant lower than that of silicon dioxide, e.g., equal to or less than about 3.9. Thus, the insulating interlayer 110 may include, for example, silicon oxide, silicon oxide doped with fluorine or carbon, porous silicon oxide, spin-on-organic polymer, or inorganic polymer, e.g., hydrogen silsesquioxane (HSSQ), methyl silsesquioxane (MSSQ), etc.

In example embodiments, the first and second contact plugs 122 and 124 may be formed by a damascene process.

In an embodiment, portions of the insulating interlayer 110 on the first and second regions I and II may be etched to form first and second contact holes, respectively, each of which may expose an upper surface of the substrate 100. A contact plug layer may be formed on the exposed upper surfaces of the substrate 100, sidewalls of the first and second contact holes, and the insulating interlayer 110 to fill the first and second contact holes, and an upper portion of the contact plug layer may be planarized until an upper surface of the insulating interlayer 110 may be exposed to form the first and second contact plugs 122 and 124. In example embodiments, each of the first and second contact plugs 122 and 124 may include a first conductive pattern and a first barrier pattern covering a bottom and a sidewall of the first conductive pattern. The first conductive pattern may include a metal, e.g., tungsten, copper, aluminum, etc., and the first barrier pattern may include a metal nitride, e.g., tantalum nitride, titanium nitride, etc.

In example embodiments, the planarization process may be performed by a chemical mechanical polishing (CMP) process and/or an etch back process.

A first lower electrode layer 132 may be formed on the upper surface of the insulating interlayer 110 and an upper surface of the first contact plug 122 on the first region I of the substrate 100.

In an example embodiment, the first lower electrode layer 132 may be formed by forming a first preliminary lower electrode layer on the upper surfaces of the insulating interlayer 110 on the first and second regions I and II of the substrate 100 and upper surfaces of the first and second contact plugs 122 and 124, and etching the first preliminary lower electrode layer using a first etching mask covering the first region I of the substrate 100 to remove a portion of the first preliminary lower electrode layer on the second region II of the substrate 100.

For example, the first preliminary lower electrode layer may include a metal nitride, e.g., tantalum nitride, titanium nitride, tungsten nitride, etc.

Figure 2:
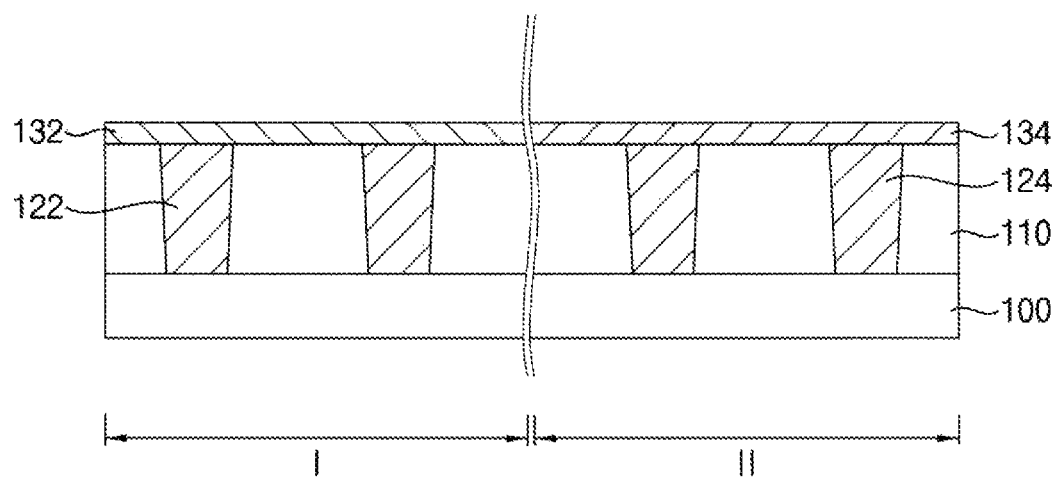

Referring to FIG. 2, a second lower electrode layer 134 may be formed on the upper surface of the insulating interlayer 110 on the second region II of the substrate 100 and the upper surface of the second contact plug 124.

In an example embodiment, the second lower electrode layer 134 may be formed by forming a second preliminary lower electrode layer on the upper surface of the insulating interlayer 110 in the second region II of the substrate 100, the upper surface of the second contact plug 124, and an upper surface and a sidewall of the first lower electrode layer 132, and planarizing an upper portion of the second preliminary lower electrode layer until the upper surface of the first lower electrode layer 132 is exposed.

Alternatively, the second lower electrode layer 134 may be formed by forming the second preliminary lower electrode layer on the upper surface of the insulating interlayer 110 in the second region II of the substrate 100, the upper surface of the second contact plug 124, and the upper surface and the sidewall of the first lower electrode layer 132, and etching the second preliminary lower electrode layer using a second etching mask covering the second region II of the substrate 100 to remove a portion of the second preliminary lower electrode layer in the first region I of the substrate 100.

For example, the second lower electrode layer 134 may include a metal nitride, e.g., tantalum nitride, titanium nitride, tungsten nitride, etc. In example embodiments, the second lower electrode layer 134 may include a material different from that of the first lower electrode layer 132. For example, the first lower electrode layer 132 may include titanium nitride, and the second lower electrode layer 134 may include tantalum nitride or tungsten nitride.

Figure 3:
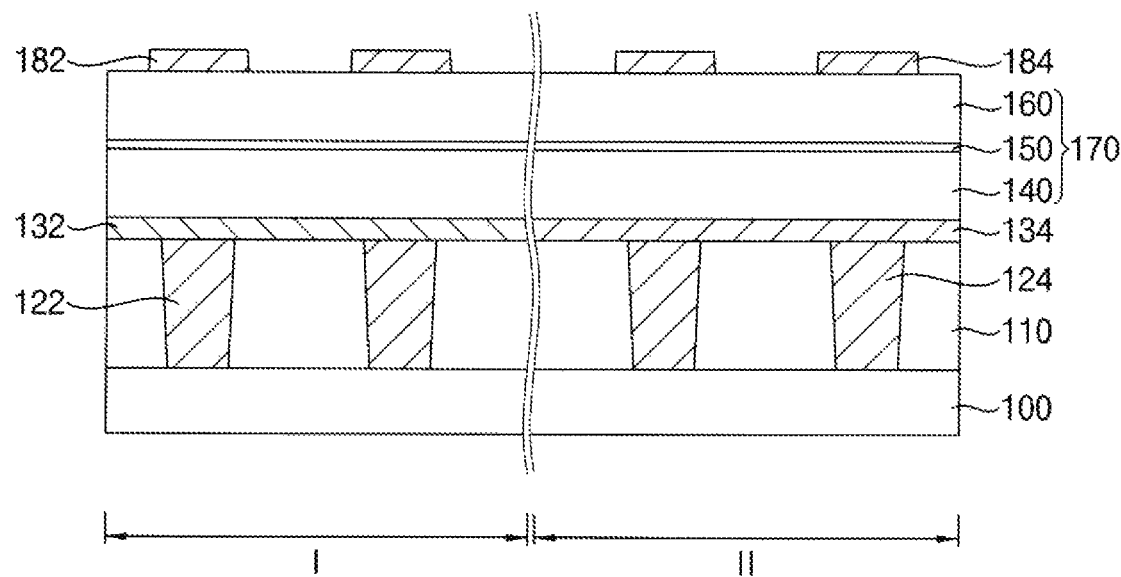

Referring to FIG. 3, a magnetic tunnel junction (MTJ) structure layer 170 may be formed on the first and second lower electrode layers 132 and 134, and first and second upper electrodes 182 and 184 may be formed on the first MTJ structure layer 170.

In example embodiments, the first MTJ structure layer 170 may include a first fixed layer structure 140, a first tunnel barrier layer 150, and a first free layer 160 stacked.

In an example embodiment, the first fixed layer structure 140 may include a pinning layer, a lower ferromagnetic layer, an anti-ferromagnetic coupling spacer layer, and an upper ferromagnetic layer.

The pinning layer may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic layers may include, e.g., Fe, Ni, and/or Co. The anti-ferromagnetic coupling spacer layer may include, e.g., Ru, Ir, and/or Rh.

The first tunnel barrier layer 150 may include, e.g., aluminum oxide or magnesium oxide, and the first free layer 160 may include, e.g., Fe, Ni, and/or Co.

In example embodiments, locations of the first fixed layer structure 140 and the first free layer 160 may be switched with each other in the first MTJ structure layer 170, or at least one of the first fixed layer structure 140, the first tunnel barrier layer 150, and the first free layer 160 may be formed in plural numbers.

Each of the first fixed layer structure 140 and the first free layer 160 in the first MTJ structure layer 170 may have a vertical or horizontal magnetization direction, and the magnetization direction of the first fixed layer structure 140 may be fixed while the magnetization direction of the first free layer 160 may be switched by 180 degrees.

A current density required for switching the magnetization direction of a free layer of an MTJ structure may be referred to as a switching current density. A data retention of the MTJ structure may increase as a switching current density of the free layer increases, while a consumption power of the MTJ structure may decrease and an operation speed of the MTJ structure may increase as the switching current density of the free layer decreases.

In example embodiments, when the first MTJ structure layer 170 is deposited on the first and second lower electrode layers 132 and 134, a switching current density or data retention of the first MTJ structure layer 170 may be influenced by material, crystallinity, surface roughness, stress, etc., of the underlying first and second lower electrode layers 132 and 134. When the first and second lower electrode layers 132 and 134 having different materials are formed in the first and second regions I and II of the substrate 100, portions of the first MTJ structure layer 170 in the respective first and second regions I and II of the substrate 100 may have different switching current densities or data retentions.

For example, the portion of the first MTJ structure layer 170 on the first lower electrode layer 132 including titanium nitride in the first region I of the substrate 100 may have a switching current density or data retention higher than that of the portion of the first MTJ structure layer 170 on the second lower electrode layer 134 including tantalum nitride or tungsten nitride in the second region II of the substrate 100, and thus may have a high consumption power and a low operation speed.

Even though the first and second lower electrode layers 132 and 134 include substantially the same material, for example, when the first lower electrode layer 132 has an amorphous material or crystallinity matching crystallinity of the first MTJ structure layer 170 and the second lower electrode layer 134 has crystallinity different from the crystallinity of the first MTJ structure layer 170, the portions of the first MTJ structure layer 170 on the respective first and second lower electrode layers 132 and 134 may have different characteristics. That is, the switching current densities, data retentions, consumption powers, and operation speeds of the portions of the first MTJ structure layer 170 in the respective first and second regions I and II may be different from each other.

The first and second upper electrodes 182 and 184 may be formed in the first and second regions I and II, respectively, of the substrate 100, and may include a metal, e.g., titanium, tantalum, tungsten, etc., and/or a metal nitride, e.g., titanium nitride, tantalum nitride, etc.

Figure 4:
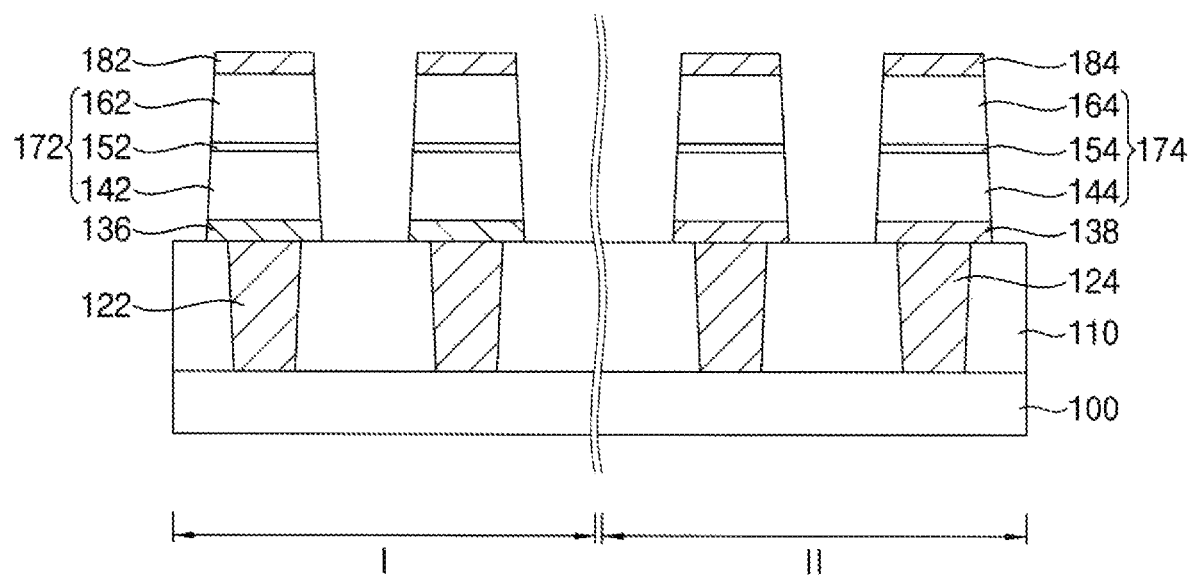

Referring to FIG. 4, an etching process may be performed using the first and second upper electrodes 182 and 184 as an etching mask to pattern the first MTJ structure layer 170, and the first and second lower electrode layers 132 and 134, so that a first lower electrode 136, a first MTJ structure 172 and the first upper electrode 182 may be sequentially stacked on the first contact plug 122, and a second lower electrode 138, a second MTJ structure 174 and the second upper electrode 184 may be sequentially stacked on the second contact plug 124.

The first MTJ structure 172 may include a first fixed structure 142, a first tunnel barrier pattern 152, and a first free layer pattern 162 sequentially stacked, and the second MTJ structure 174 may include a second fixed structure 144, a second tunnel barrier pattern 174, and a second free layer pattern 164 sequentially stacked.

In example embodiments, the etching process may be performed by a physical etching process, e.g., an ion beam etching (IBE) process using, e.g., argon ions, krypton ions, etc.

In an embodiment, the first and second MTJ structures 172 and 174 in the respective first and second regions I and II of the substrate 100 may be influenced by the characteristics, e.g., material, crystallinity, surface roughness, stress, etc., of the underlying first and second lower electrodes 136 and 138, and may have different characteristics, e.g., different switching current densities, data retentions, etc. In an example embodiment, the switching current density of the first MTJ structure 172 may be different from that of the second MTJ structure 174 by about 10% of the switching current density of the first MTJ structure 172, and the data retention of the first MTJ structure 172 may be different from that of the second MTJ structure 174 by about 1000 times.

Accordingly, the MRAM device including the first and second MTJ structures 172 and 174 may be fabricated to have different characteristics in different regions, for example, a high data retention in one region, and a lower consumption power and a high operation speed in another region.

Figure 5:
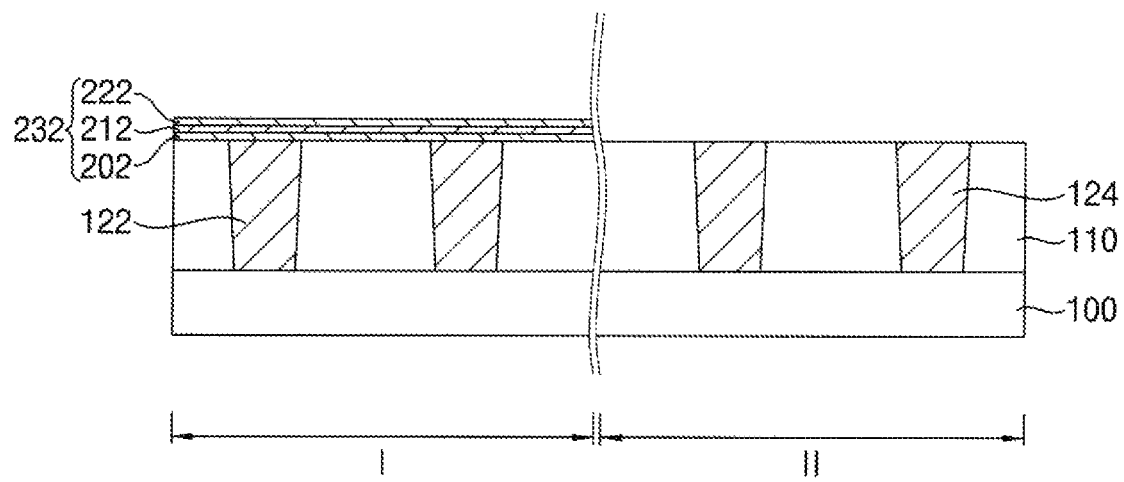
Figure 6:
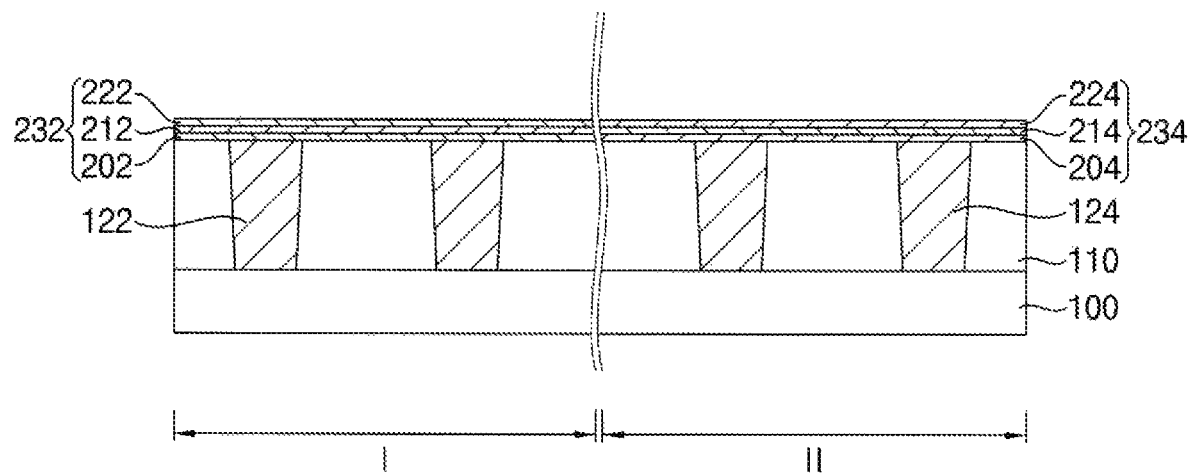
Figure 7:
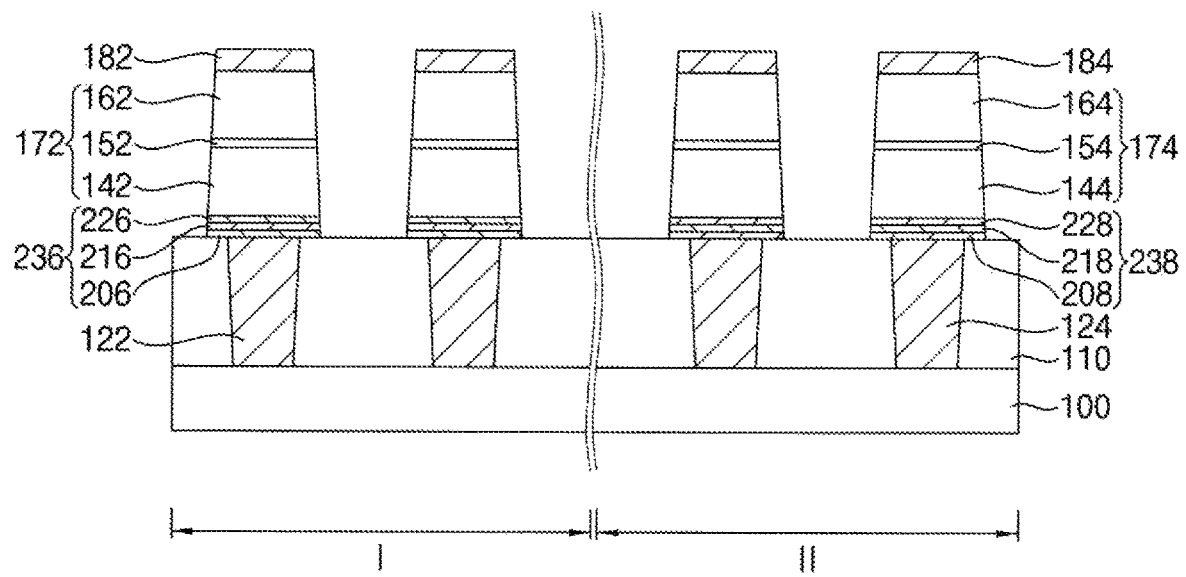

FIGS. 5 to 7 are cross-sectional views illustrating a method of manufacturing an MRAM device.

This method may include processes substantially the same as or similar to those illustrated with reference to FIGS. 1 to 4.

Referring to FIG. 5, processes substantially the same as or similar to those illustrated with reference to FIG. 1 may be performed. However, unlike the first lower electrode layer 132 having a single layer in FIG. 1, a third lower electrode layer 232 including a plurality of layers sequentially stacked may be formed in the first region I of the substrate 100.

In example embodiments, the third lower electrode layer 232 may include a plurality of layers each including a metal, e.g., ruthenium, tantalum, etc., or a metal nitride, e.g., titanium nitride, tantalum nitride, etc. In an example embodiment, the third lower electrode layer 232 may include first, second, and third layers 202, 212, and 222 sequentially stacked, which may include ruthenium, tantalum, and ruthenium, respectively. Alternatively, the first, second, and third layers 202, 212, and 222 may include titanium nitride, tantalum, and titanium nitride, respectively. In some embodiments, the third lower electrode layer 232 may include more than 3 layers.

Referring to FIG. 6, processes substantially the same as or similar to those illustrated with reference to FIG. 2 may be performed. However, instead of forming the second lower electrode layer 134 having a single layer, a fourth lower electrode layer 234 including a plurality of layers sequentially stacked may be formed in the second region II of the substrate 100.

In example embodiments, the fourth lower electrode layer 234 may include a plurality of layers each including a metal, e.g., ruthenium, tantalum, etc., or a metal nitride, e.g., titanium nitride, tantalum nitride, etc. In an example embodiment, the fourth lower electrode layer 234 may include fourth, fifth, and sixth layers 204, 214, and 224 sequentially stacked. The fourth to sixth layers 204, 214, and 224 may have thicknesses equal to those of the respective first to third layers 202, 212, and 222 corresponding thereto, however, at least one of the fourth to sixth layers 204, 214, and 224 may include a material different from that of the corresponding one of the first to third layers 202, 212, and 222. In some embodiments, the fourth lower electrode layer 234 may include more than 3 layers as the third lower electrode layer 232.

Referring to FIG. 7, processes substantially the same as or similar to those illustrated with reference to FIGS. 3 and 4 may be performed to complete the manufacture of the MRAM device.

In an embodiment, a third lower electrode 236, the first MTJ structure 172, and the first upper electrode 182 may be sequentially stacked on the first contact plug 122, and a fourth lower electrode 238, the second MTJ structure 174, and the second upper electrode 184 may be sequentially stacked on the second contact plug 124.

The third lower electrode 236 may include first, second, and third patterns 206, 216, and 226 sequentially stacked, and the fourth lower electrode 238 may include fourth, fifth, and sixth patterns 208, 218, and 228 sequentially stacked.

In an embodiment, the first and second MTJ structures 172 and 174 in the respective first and second regions I and II of the substrate 100 may be influenced by the characteristics, e.g., material, crystallinity, surface roughness, stress, etc., of the underlying respective third and fourth electrodes 236 and 238, and may have different characteristics, e.g., different switching current densities, data retentions. Accordingly, the MRAM device including the first and second MTJ structures 172 and 174 may be fabricated to have different characteristics in different regions, for example, a high data retention in one region, and a lower consumption power and a high operation speed in another region.

Figure 8:
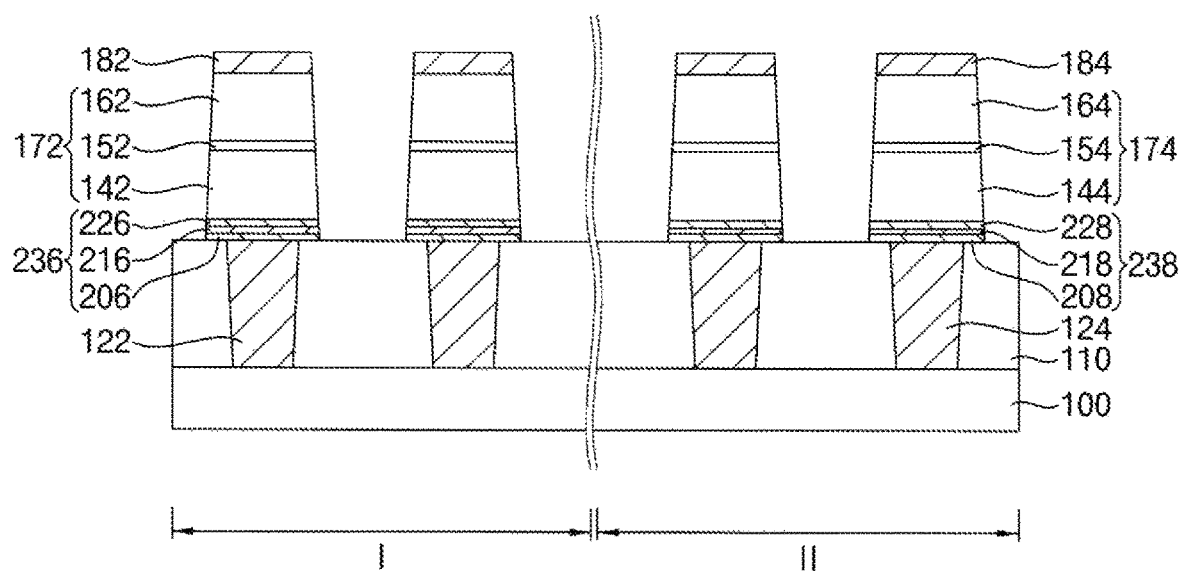
Figure 9:
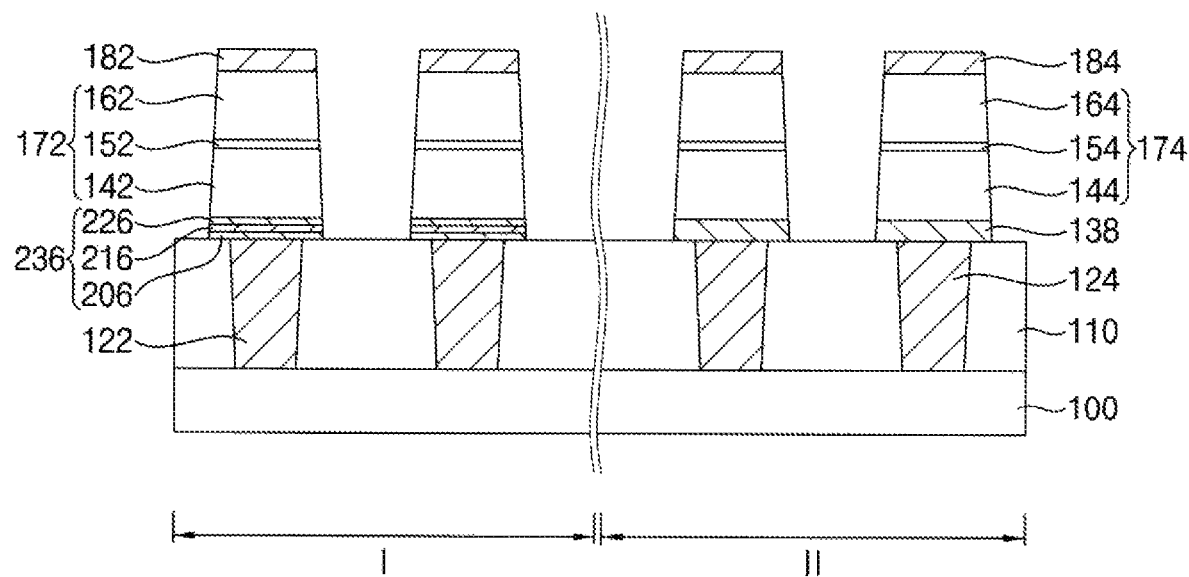

FIGS. 8 and 9 are cross-sectional views illustrating a method of manufacturing an MRAM device.

This method may include processes substantially the same as or similar to those illustrated with reference to FIGS. 1 to 4 or FIGS. 5 to 7.

Referring to FIG. 8, the third and fourth lower electrodes 236 and 238 may be formed on the first and second contact plugs 122 and 124, respectively.

In example embodiments, the fourth to sixth patterns 208, 218, and 228 of the fourth lower electrode 238 may include materials substantially the same as those of the first to third patterns 206, 216, and 226 of the third lower electrode 236. However, at least one of the fourth to sixth patterns 208, 218, and 228 may have a thickness different from that of corresponding one of the first to third patterns 206, 216, and 226.

Accordingly, even though the third and fourth lower electrodes 236 and 238 under the respective first and second MTJ structures 172 and 174 may include substantially the same material, at least one of the patterns of the third lower electrode 236 may have a different thickness from that of the corresponding one of the patterns of the fourth lower electrode 238. Thus, the first and second MTJ structures 172 and 174 may have different characteristics, e.g., different switching current densities, data retentions, consumption powers, operation speeds, etc.

In an example embodiment, the third and fourth lower electrodes 236 and 238 may have substantially the same thickness as each other.

Referring to FIG. 9, the third and second lower electrodes 236 and 138 may be formed on the first and second contact plugs 122 and 124, respectively.

That is, the third lower electrode 236 including the first to third patterns 206, 216, and 226 may be formed on the first contact plug 122, and the second lower electrode 138 having a single layer may be formed on the second contact plug 124.

The third and second lower electrodes 236 and 138 may have different materials from each other, and thus the first and second MTJ structures 172 and 174 may have different characteristics, e.g., different switching current densities, data retentions, consumption powers, operation speeds, etc.

Figure 10:
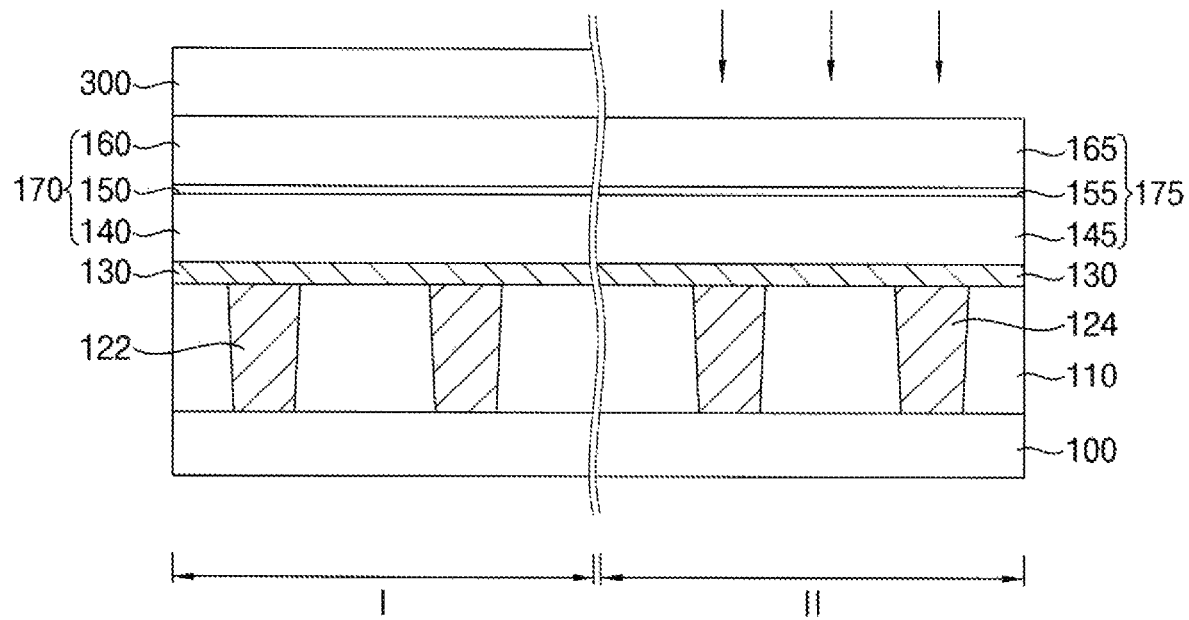
Figure 11:
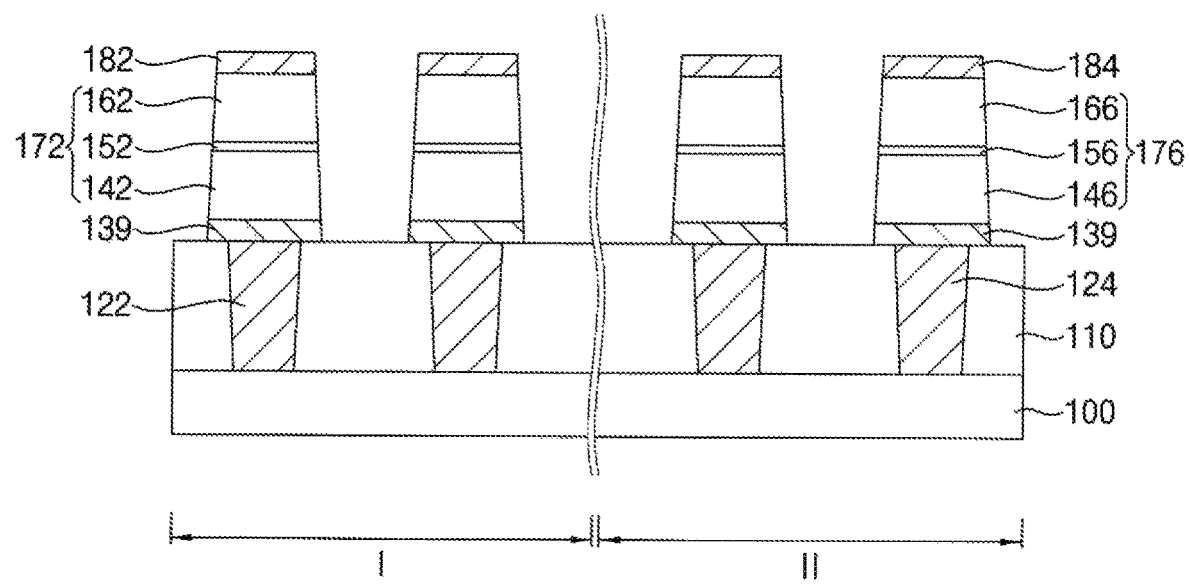

FIGS. 10 and 11 are cross-sectional views illustrating a method of manufacturing an MRAM device.

This method may include processes substantially the same as or similar to those illustrated with reference to FIGS. 1 to 4.

Referring to FIG. 10, like the processes substantially the same as or similar to those illustrated with reference to FIG. 1, the insulating interlayer 110 may be formed on the substrate 100, and the first and second contact plugs 122 and 124 may be formed through the insulating interlayer 110.

However, a fifth lower electrode layer 130 may be formed on the insulating interlayer 110, and the first and second contact plugs 122 and 124. That is, the fifth lower electrode layer 130 may be commonly formed on the first and second regions I and II of the substrate 100.

Like the processes substantially the same as or similar to those illustrated with reference to FIG. 3, the first MTJ structure layer 170 may be formed on the fifth lower electrode layer 130.

In an embodiment, a first mask 300 covering the first region I of the substrate 100 may be formed on the first MTJ structure layer 170, and chemical or physical treatment may be performed on a portion of the first MTJ structure layer 170 in the second region II of the substrate 100, so that a second MTJ structure layer 175 may be formed in the second region II of the substrate 100, and the first MTJ structure layer 170 may remain in the first region I of the substrate 100. The second MTJ structure layer 175 may include a second fixed layer structure 145, a second tunnel barrier layer 155, and a second free layer 165 sequentially stacked.

In example embodiments, the chemical treatment may include an annealing process under hydrogen atmosphere. Thus, the first and second MTJ structure layers 170 and 175 on the respective first and second regions I and II of the substrate 100 may have different characteristics, e.g., different switching current densities, data retentions, etc. In an example embodiment, the first MTJ structure layer 170 remaining in the first region I of the substrate 100 may have a relatively high switching current density and a relatively high data retention, while the chemically treated second MTJ structure layer 175 may have a relatively low consumption power and a relatively high operation speed.

In example embodiments, the physical treatment may include an ion bombardment process using argon ions, krypton ions, etc. Thus, first and second MTJ structure layers 170 and 175 in the respective first and second regions I and II of the substrate 100 may have different characteristics, e.g., different switching current densities, data retentions, etc. In an example embodiment, the first MTJ structure layer 170 remaining in the first region I of the substrate 100 may have a relatively high switching current density and a relatively high data retention, while the chemically treated second MTJ structure layer 175 may have a relatively low consumption power and a relatively high operation speed. The energy, amount of dose used in the ion bombardment process may be adjusted so that the characteristics of the second MTJ structure layer 175 may be controlled.

Referring to FIG. 11, after removing the first mask 300, the first and second upper electrodes 182 and 184 may be formed on the first and second MTJ structure layers 170 and 175, respectively.

Processes substantially the same as or similar to those illustrated with reference to FIG. 4 may be performed to complete the manufacture of the MRAM device.

Thus, a fifth lower electrode 139, the first MTJ structure 172, and the first upper electrode 182 may be sequentially stacked on the first contact plug 122, and the fifth lower electrode 139, a third MTJ structure 176, and the second upper electrode 184 may be sequentially stacked on the second contact plug 124. The third MTJ structure 176 may include a third fixed structure 146, a third tunnel barrier pattern 156, and a third free layer pattern 166 sequentially stacked.

As illustrated above, the first and third MTJ structures 172 and 176 in the respective first and second regions I and II of the substrate 100 may have different characteristics, e.g., different switching current densities, data retentions, etc., by the chemical or physical treatment. Accordingly, the MRAM device including the first and third MTJ structures 172 and 176 may be fabricated to have different characteristics in different regions, for example, a high switching current density and a high data retention in one region, and a lower consumption power and a high operation speed in another region.

Figure 12:
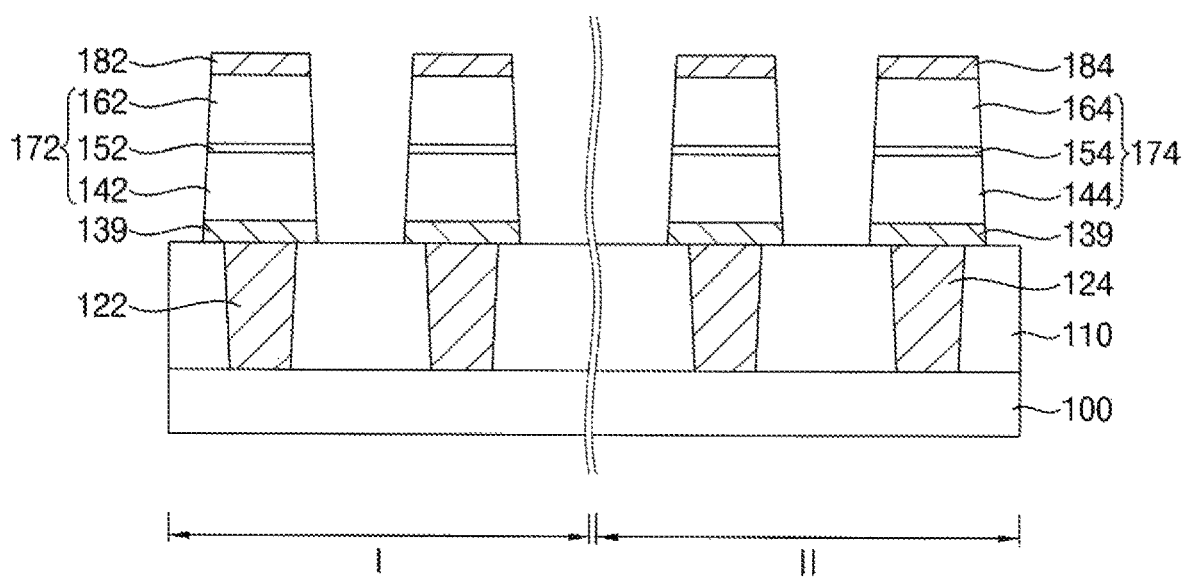
Figure 13:
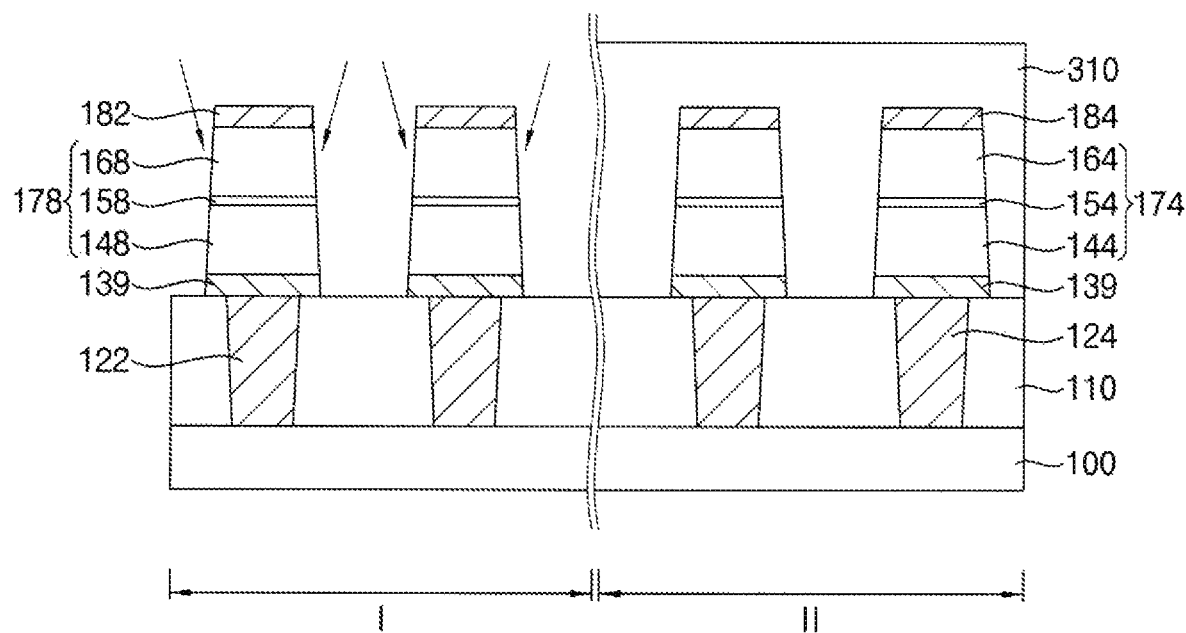
Figure 14:
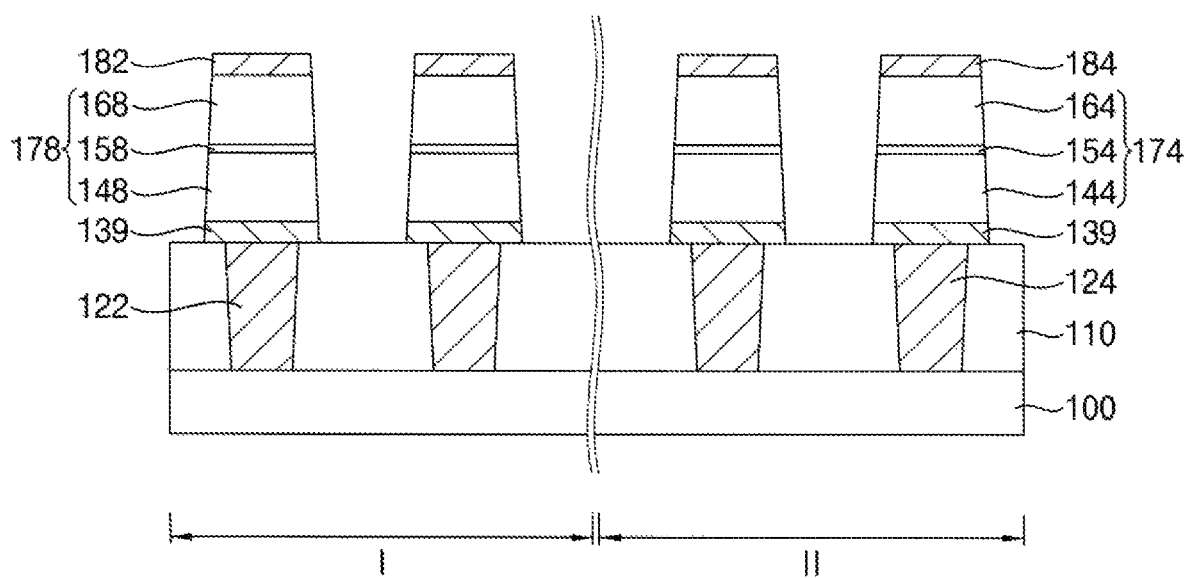

FIGS. 12 to 14 are cross-sectional views illustrating a method of manufacturing an MRAM device.

This method may include processes substantially the same as or similar to those illustrated with reference to FIGS. 1 to 4 or FIGS. 10 to 11.

Referring to FIG. 12, processes substantially the same as or similar to those illustrated with reference to FIGS. 10 and 11 may be performed.

However, unlike those illustrated with reference to FIG. 10, the portion of the first MTJ structure layer 170 on the second region II of the substrate 100 may not be chemically or physically treated.

Thus, the fifth lower electrode 139, the first MTJ structure 172, and the first upper electrode 182 may be sequentially stacked on the first contact plug 122, and the fifth lower electrode 139, the second MTJ structure 174, and the second upper electrode 184 may be sequentially stacked on the second contact plug 124.

Referring to FIG. 13, chemical or physical treatment may be performed as the processes substantially the same as or similar to those FIG. 10.

In an embodiment, the chemical or physical treatment may be performed on the first MTJ structure 172 that may be formed by patterning the first MTJ structure layer 170. A second mask 310 covering the second MTJ structure 174 in the second region II of the substrate 100 may be formed on the insulating interlayer 110, and chemical or physical treatment may be performed on the first MTJ structure 172 in the first region I of the substrate 100 to form a fourth MTJ structure 178. The fourth MTJ structure 178 may include a fourth fixed structure 148, a fourth tunnel barrier pattern 158, and a fourth free layer pattern 168 sequentially stacked.

Referring to FIG. 14, the second mask 310 may be removed.

As illustrated above, the fourth and second MTJ structures 178 and 174 in the respective first and second regions I and II of the substrate 100 may have different characteristics, e.g., different switching current densities, data retentions, etc., by the chemical or physical treatment. Accordingly, the MRAM device including the fourth and second MTJ structures 178 and 174 may be easily fabricated to have different characteristics in different regions, for example, a high switching current density and a high data retention in one region, and a lower consumption power and a high operation speed in another region.

FIGS. 15 to 35 are plan views and cross-sectional views illustrating a method of manufacturing an MRAM device in accordance with example embodiments.

Figure 15:
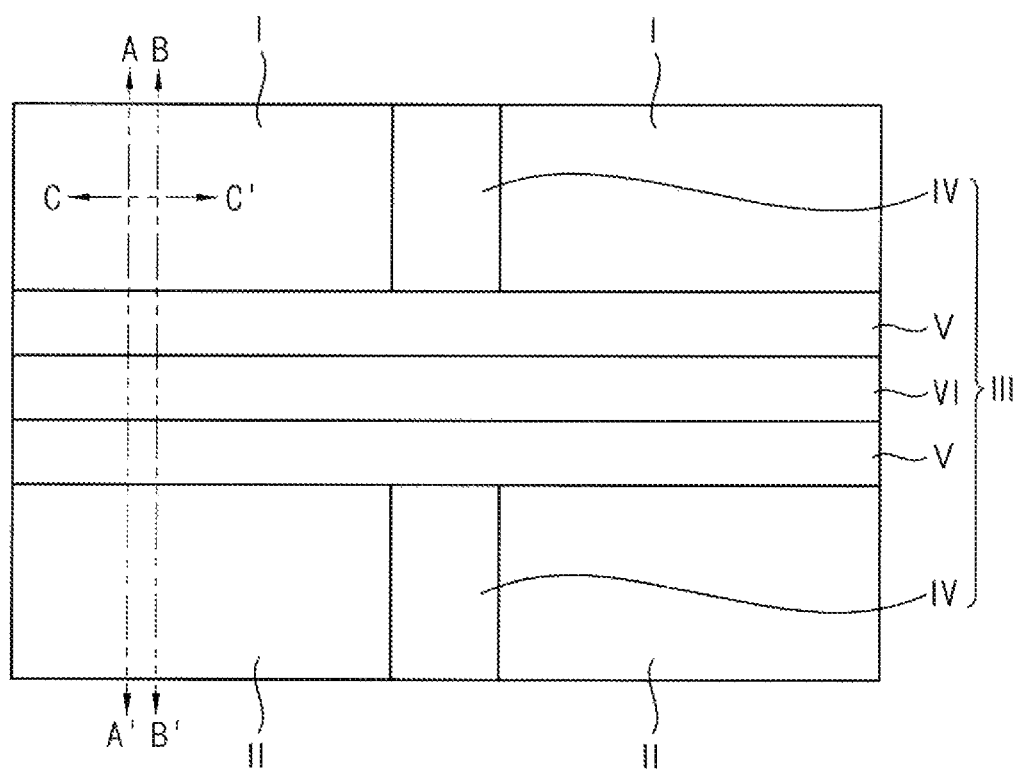
Figure 15:
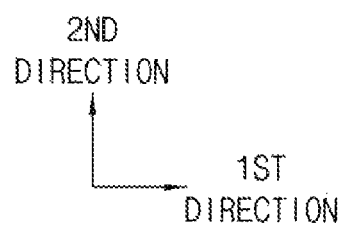

FIGS. 16, 17, 18, 19 and 25 are cross-sectional views taken along line A-A' of FIG. 15, FIGS. 21, 23, 26, 28, 30, 32 and 34 are cross-sectional views taken along line B-B' of FIG. 15, and FIGS. 20, 22, 24, 27, 29, 31, 33 and 35 are cross-sectional views taken along line C-C' of FIG. 15.

This method of manufacturing the MRAM device may include processes substantially the same as or similar to those illustrated with reference to FIGS. 1 to 4.

Figure 16:
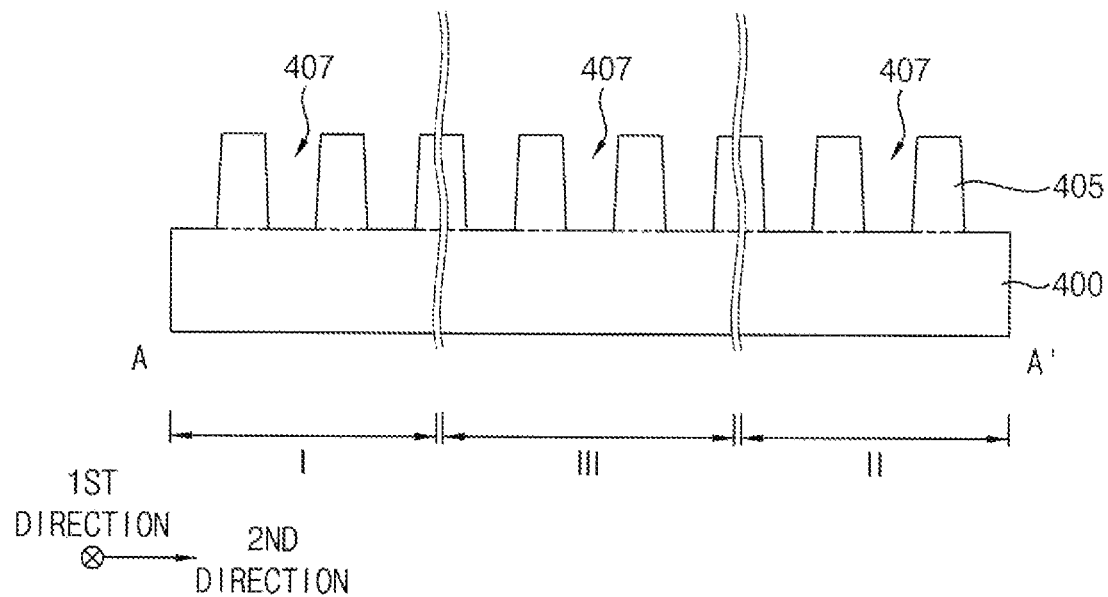

Referring to FIGS. 15 and 16, an upper portion of a substrate 400 may be partially etched to form a first recess 407.

The substrate 400 may include first, second, and third regions I, II, and III. Each of the first and second regions I and II may serve as a memory cell region, and the third region III may serve as a peripheral circuit region in which peripheral circuits may be formed.

In example embodiments, the third region III may include fourth, fifth, and sixth regions IV, V, and VI. In an example embodiment, the fourth region IV may serve as a row decoder region, the fifth region V may serve as a column decoder region, and the sixth region IV may serve as a sense amplifier region.

In an example embodiment, a plurality of first regions I may be formed in a first direction substantially parallel to an upper surface of the substrate 100, which may be spaced apart from each other by the fourth region IV. In an embodiment, a plurality of second regions II may be formed in the first direction, which may be spaced apart from each other by the fourth region IV.

In example embodiments, the first and second regions I and II may be spaced apart from each other by the fifth and sixth regions V and VI in a second direction substantially parallel to the upper surface of the substrate 100 and substantially perpendicular to the first direction.

As the first recess 407 is formed on the substrate 400, an active region 405 and a field region may be defined on the substrate 400. The active region 405 may be also referred to as an active fin.

In example embodiments, the active fin 405 may extend in the first direction, and a plurality of active fins 405 may be formed in the second direction.

Figure 17:
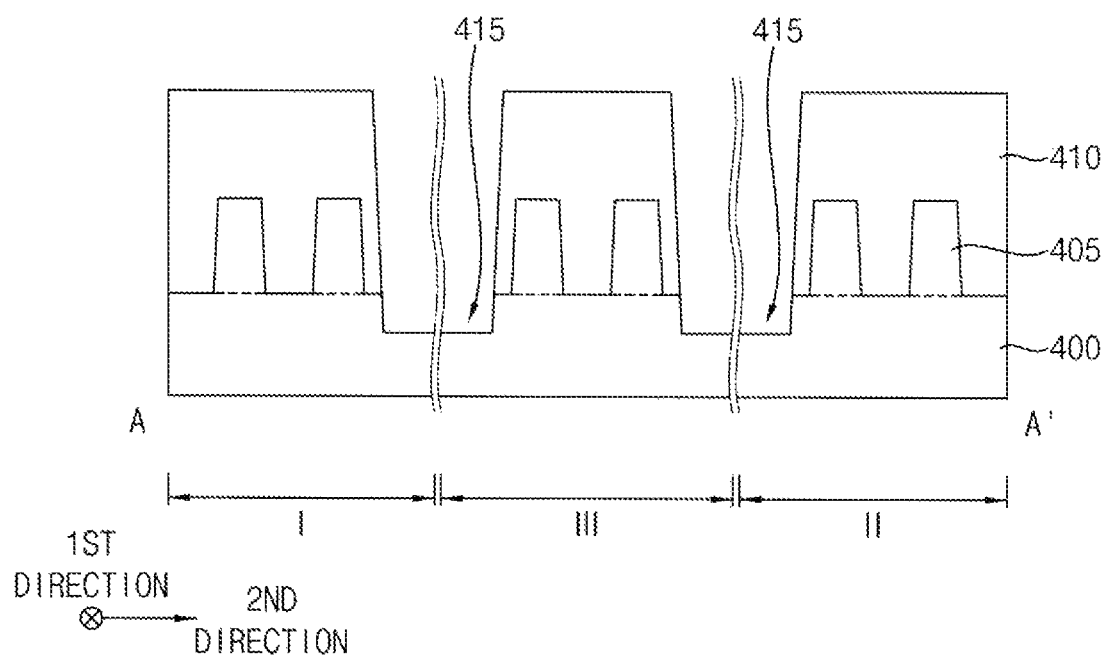

Referring to FIG. 17, a third etching mask 410 may be formed on a portion of the substrate 400, and a portion of the substrate 400 may be removed using the third etching mask 410.

In example embodiments, a portion of the active fin 405 and a portion of the substrate 400 thereunder may be removed, and thus a second recess 415 may be formed on the substrate 400.

Figure 18:
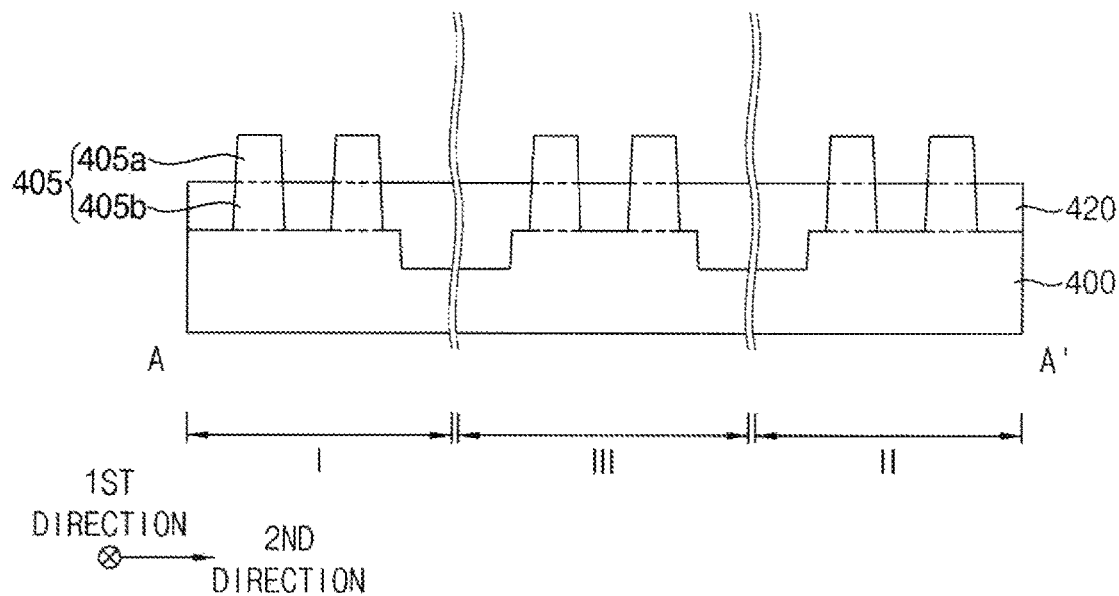

Referring to FIG. 18, after removing the third etching mask 410, an isolation pattern 420 may be formed on the substrate 100 to fill the second recess 415 and a portion of the first recess 407.

The isolation pattern 420 may be formed by forming an isolation layer on the substrate 400 to fill the first and second recesses 407 and 415, planarizing the isolation layer until an upper surface of the active fin 405 may be exposed, and an upper portion of the isolation layer may be removed to expose an upper sidewall of the first recess 407.

As the isolation pattern 420 is formed on the substrate 400, the active fin 405 may be divided into a lower active pattern 405b of which a sidewall is covered by the isolation pattern 420, and an upper active pattern 405a protruding from an upper surface of the isolation pattern 420.

Figure 19:
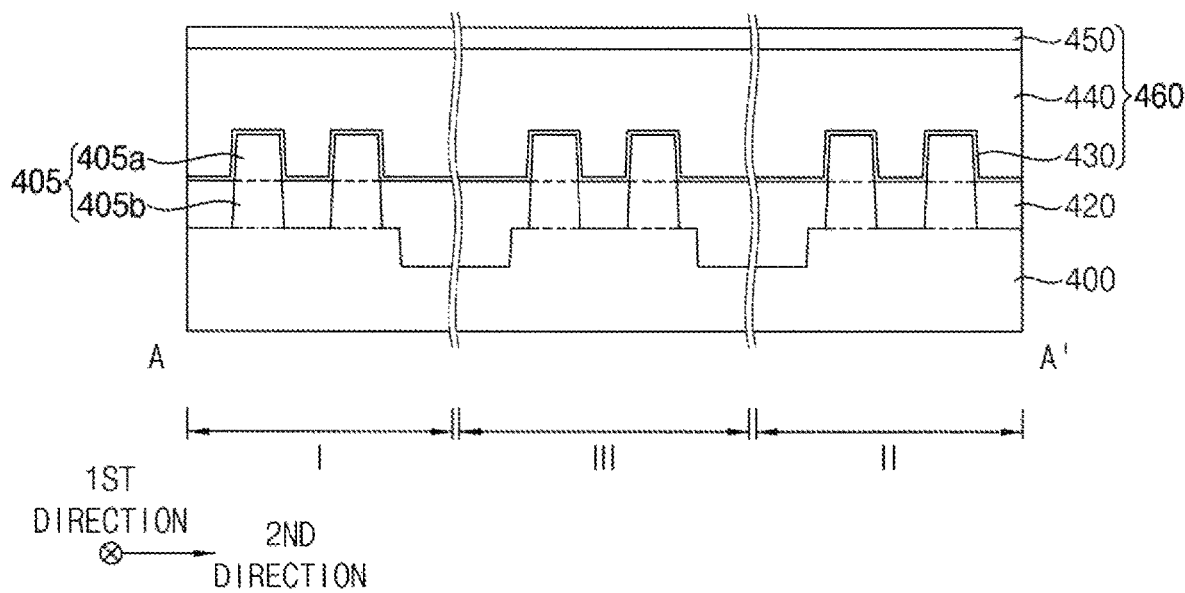
Figure 20:
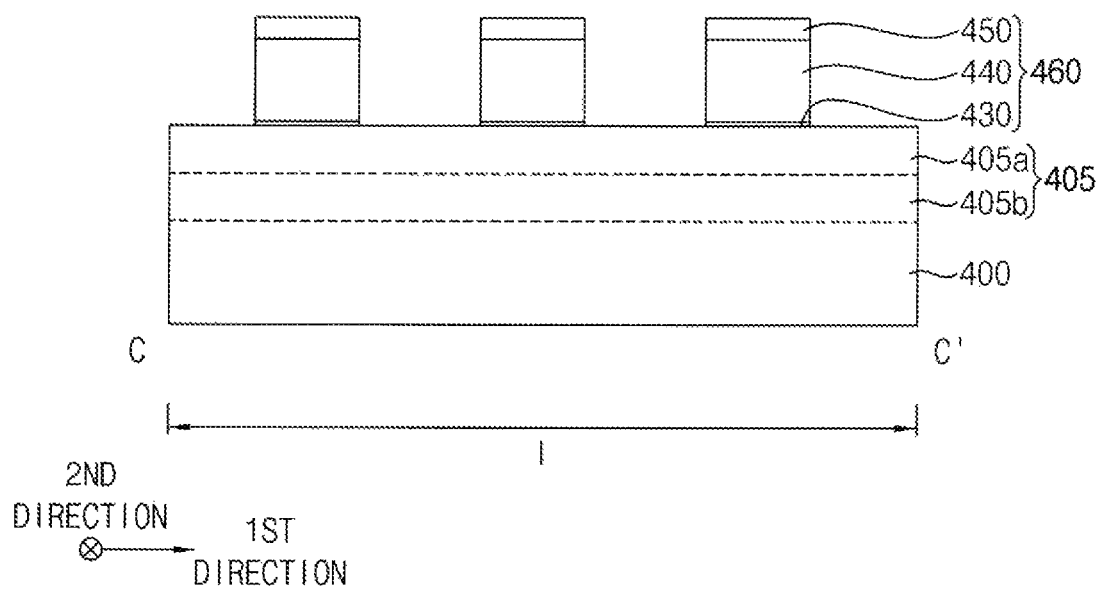

Referring to FIGS. 19 and 20, a dummy gate structure 460 may be formed on the substrate 400.

In an embodiment, the dummy gate structure 460 may be formed by sequentially forming a dummy gate insulation layer, a dummy gate electrode layer, and a dummy gate mask layer on the active fin 405 of the substrate 400 and the isolation pattern 420, patterning the dummy gate mask layer to form a dummy gate mask 450, and sequentially etching the dummy gate electrode layer and the dummy gate insulation layer using the dummy gate mask 450 as an etching mask.

Thus, the dummy gate structure 460 may include a dummy gate insulation pattern 430, a dummy gate electrode 440 and the dummy gate mask 450 sequentially stacked on the substrate 100.

In example embodiments, the dummy gate structure 460 may extend in the second direction, and a plurality of dummy gate structures 460 may be formed in the first direction.

Figure 21:
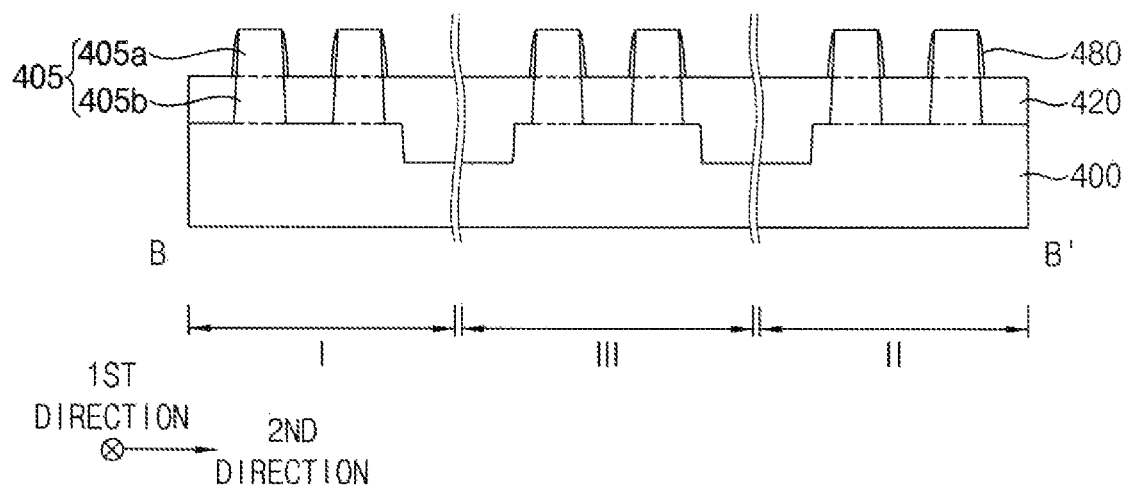
Figure 22:
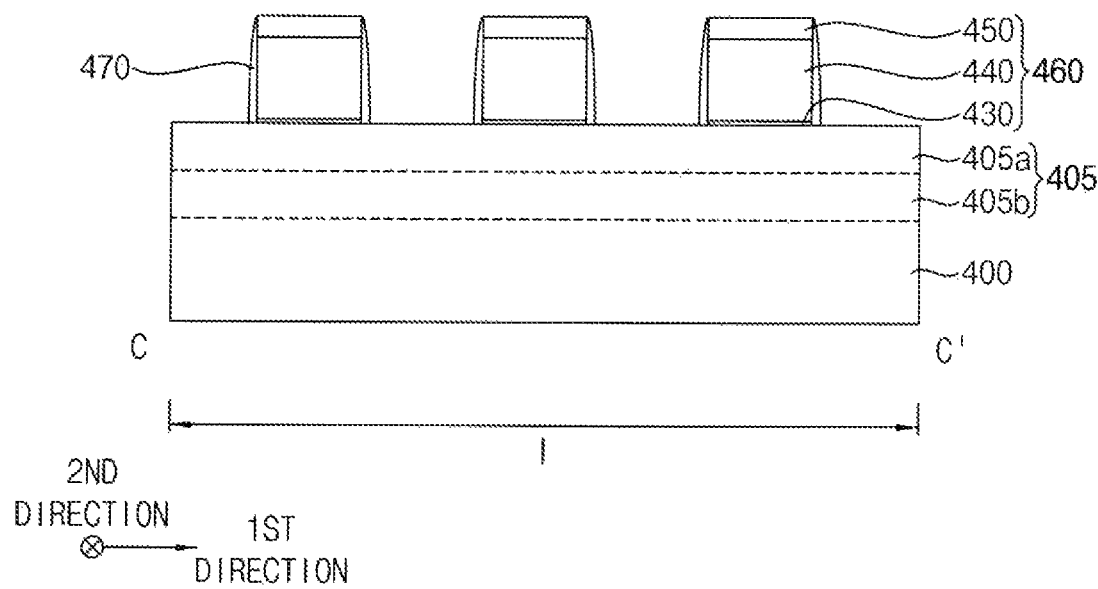

Referring to FIGS. 21 and 22, a gate spacer 470 may be formed on a sidewall of the dummy gate structure 460.

The gate spacer 470 may be formed by forming a spacer layer on the active fin 405 of the substrate 400 and the isolation pattern 420 to cover the dummy gate structure 460, and anisotropically etching the spacer layer. The gate spacer 470 may be formed on the sidewall of the dummy gate structure 460, and a fin spacer 480 may be formed on a sidewall of the upper active pattern 405a.

Figure 23:
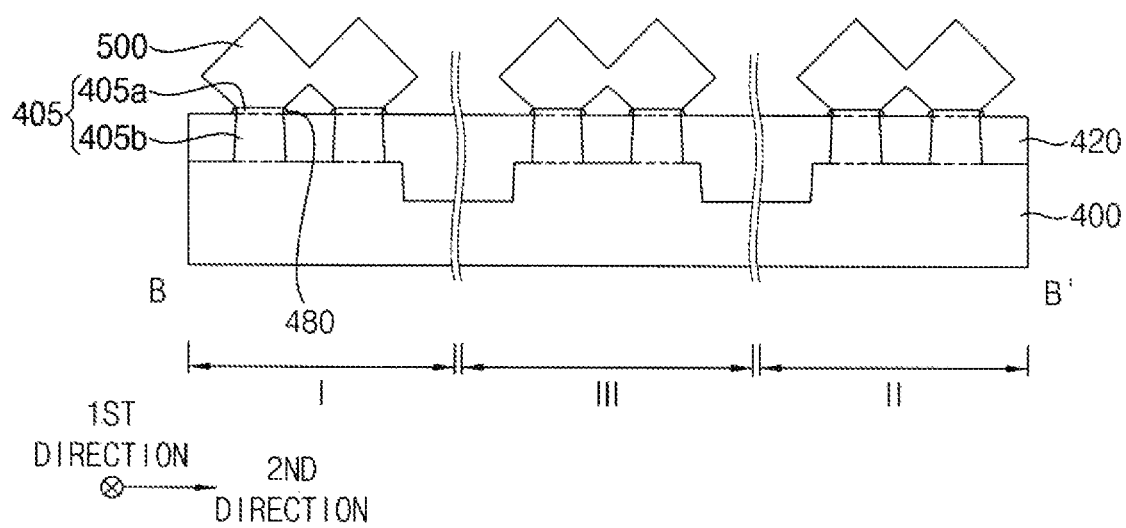
Figure 24:
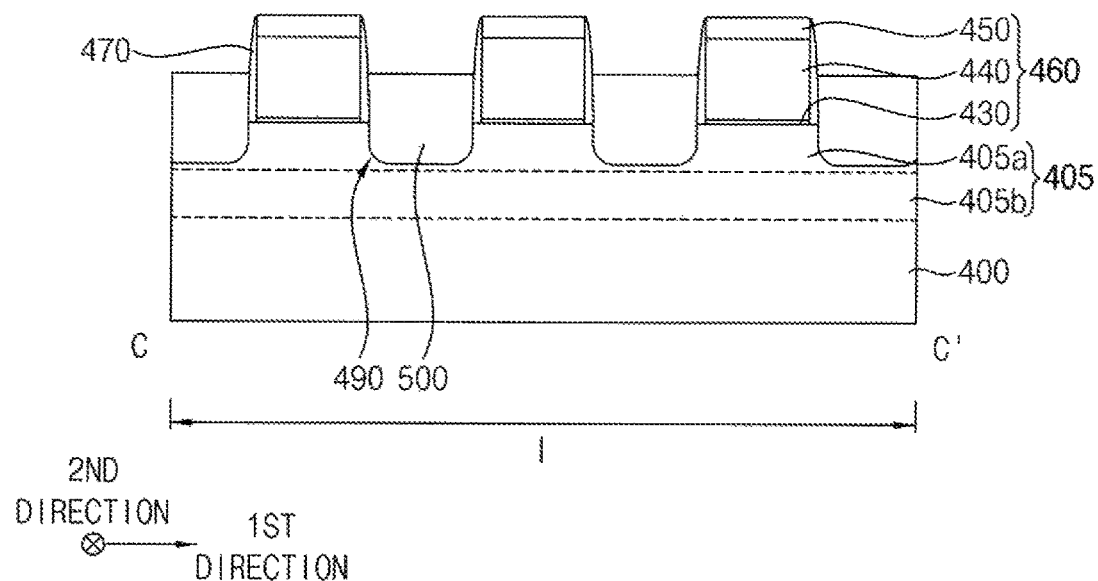

Referring to FIGS. 23 and 24, an upper portion of the active fin 405 adjacent the gate spacer 470 may be etched to form a third recess 490.

In an embodiment, the upper portion of the active fin 405 may be removed by a dry etching process using the dummy gate structure 460 and the gate spacer 470 on the sidewall thereof as an etching mask to form the third recess 490. When the third recess 490 is formed, the fin spacer 480 adjacent the active fin 405 may be mostly removed, however, a lower portion of the fin spacer 480 may remain.

A source/drain layer 500 may be formed in the third recess 490.

In example embodiments, the source/drain layer 500 may be formed by a selective epitaxial growth (SEG) process using an upper surface of the active fin 405 exposed by the third recess 490 as a seed.

In example embodiments, by the SEG process, a single crystalline silicon-germanium layer may be formed to serve as the source/drain layer 500. A p-type impurity source gas may be also used in the SEC process to form a single crystalline silicon-germanium layer doped with p-type impurities serving as the source/drain layer 500. Thus, the source/drain layer 500 may serve as a source/drain region of a positive-channel metal oxide semiconductor (PMOS) transistor.

The source/drain layer 500 may grow not only in a vertical direction but also in a horizontal direction to fill the third recess 490, and may contact a sidewall of the gate spacer 470.

In example embodiments, when the active fins 405 disposed in the second direction are close to each other, the source/drain layers 500 growing on the respective active fins 405 may be merged with each other.

In an embodiment, the source/drain layer 500 serves as the source/drain region of the PMOS transistor. In an embodiment, the source/drain layer 500 serves as a source/drain region of a negative-channel metal oxide semiconductor (NMOS) transistor.

Thus, a single crystalline silicon carbide layer or a single crystalline silicon layer may be formed as the source/drain layer 500. In the SEG process, an n-type impurity source gas may be also used to form a single crystalline silicon carbide layer doped with n-type impurities.

Figure 25:
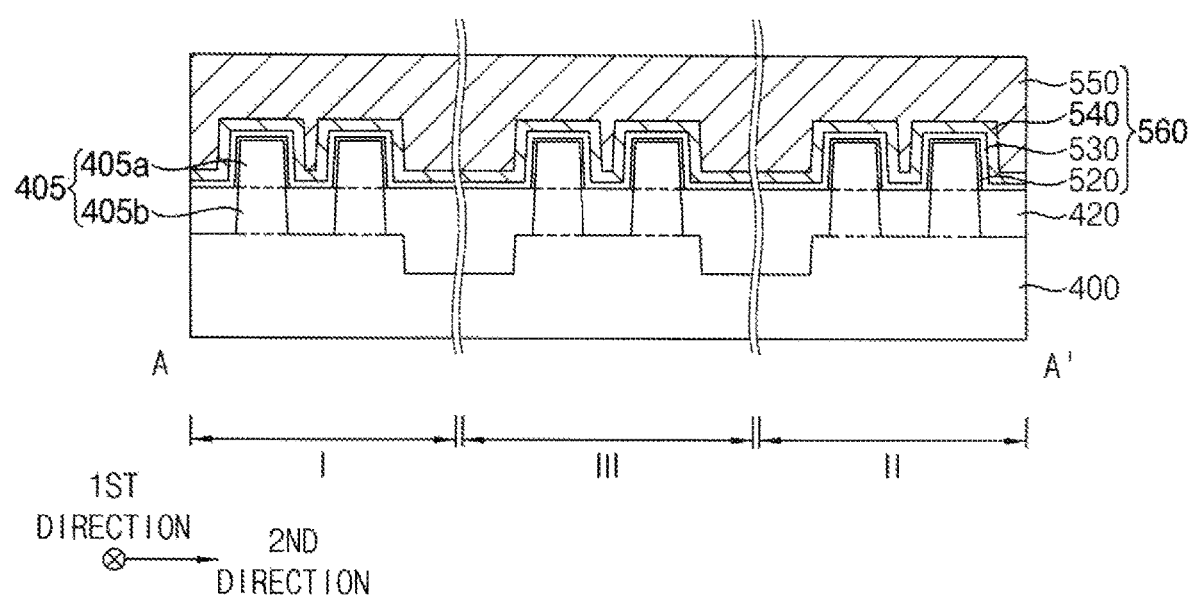
Figure 26:
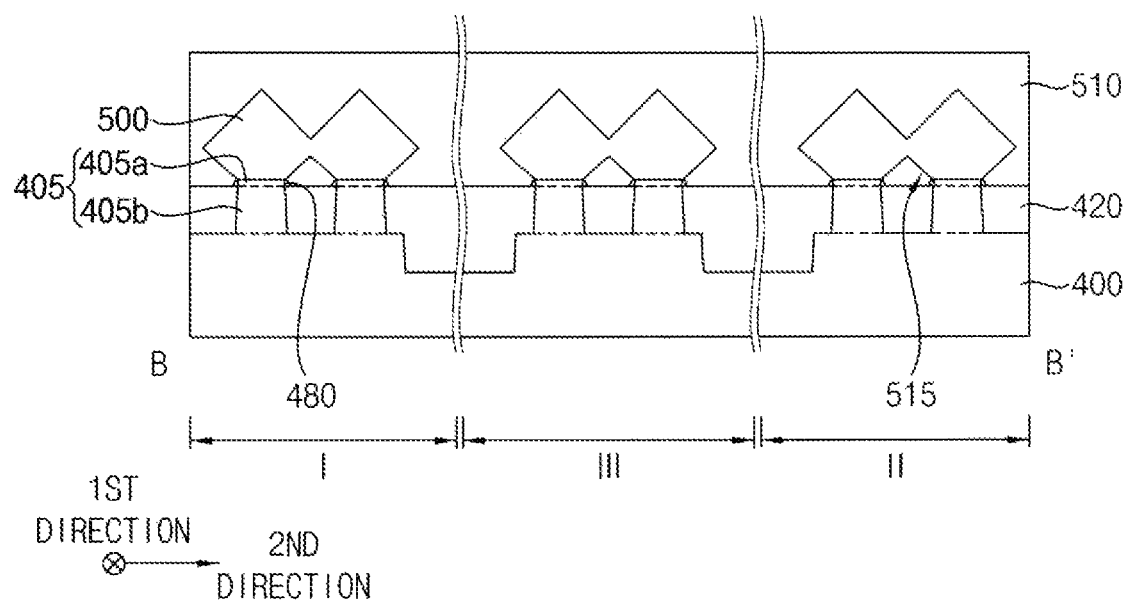
Figure 27:
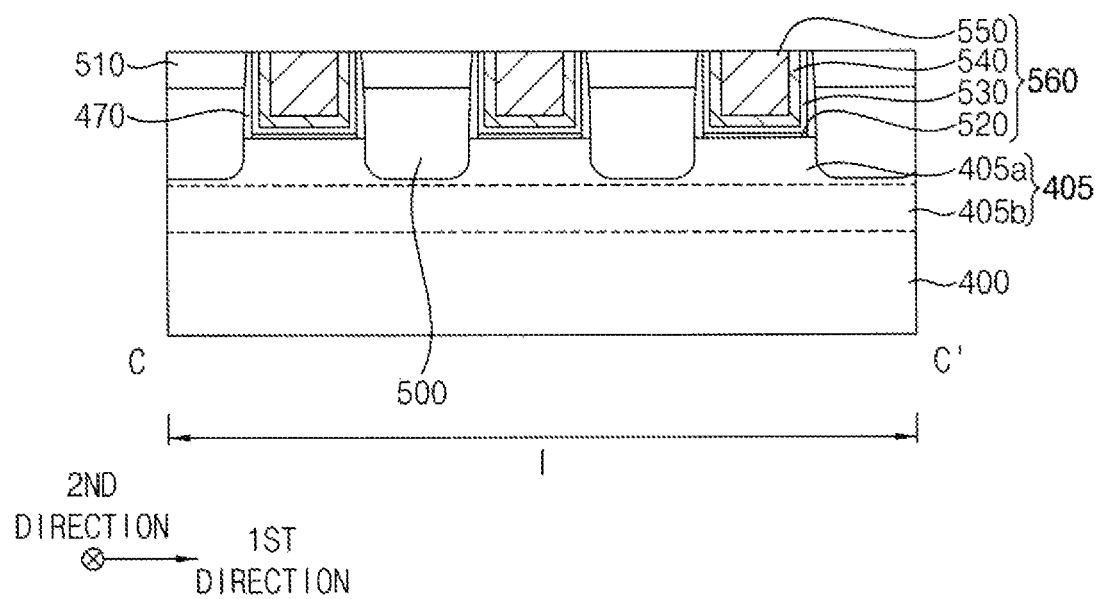

Referring to FIGS. 25 to 27, an insulation layer 510 may be formed on the substrate 400 to cover the dummy gate structure 460, the gate spacer 470, the source/drain layer 500, and the fin spacer 480, and may be planarized until an upper surface of the dummy gate electrode 440 of the dummy gate structure 460 may be exposed.

During the planarization process, the dummy gate mask 450 may be also removed, and an upper portion of the gate spacer 470 may be removed. A space between the merged source/drain layer 500 and the isolation pattern 420 may not be fully filled, and thus an air gap 515 may be formed.

The exposed dummy gate electrode 440 and the dummy gate insulation pattern 430 thereunder may be removed to form a first opening exposing an inner sidewall of the gate spacer 470 and an upper surface of the active fin 405, and a gate structure 560 may be formed to fill the first opening.

The gate structure 560 may be formed by following processes.

A thermal oxidation process may be performed on the exposed upper surface of the active fin 405 by the first opening to form an interface pattern 520, a gate insulation layer and a work function control layer may be sequentially formed on the interface pattern 520, the isolation pattern 420, the gate spacer 470, and the insulation layer 510, and a gate electrode layer may be formed on the work function control layer to sufficiently fill a remaining portion of the first opening.

The interface pattern 520 may be formed by a chemical vapor deposition (CVD) process or an atomic layer deposition (ALD) process instead of the thermal oxidation process, and in this case, the interface pattern 520 may be formed not only on the upper surface of the active fin 405 but also on the upper surface of the isolation 420 and the inner wall of the gate spacer 470.

The gate electrode layer, the work function control layer, and the gate insulation layer may be planarized until the upper surface of the insulation layer 510 may be exposed to form a gate insulation pattern 530 and a work function control pattern 540 sequentially stacked on the upper surface of the interface pattern 520, the upper surface of the isolation pattern 420, and the inner wall of the gate spacer 470, and to form a gate electrode 550 filling the remaining portion of the first opening on the work function control pattern 540. Thus, a bottom and a sidewall of the gate electrode 550 may be covered by the work function control pattern 540.

The interface pattern 520, the gate insulation pattern 530, the work function control pattern 540, and the gate electrode 550 sequentially stacked may form the gate structure 560, and the gate structure 560 together with the source/drain layer 500 may form a PMOS transistor or an NMOS transistor according to the conductivity type of the source/drain layer 500.

Figure 28:
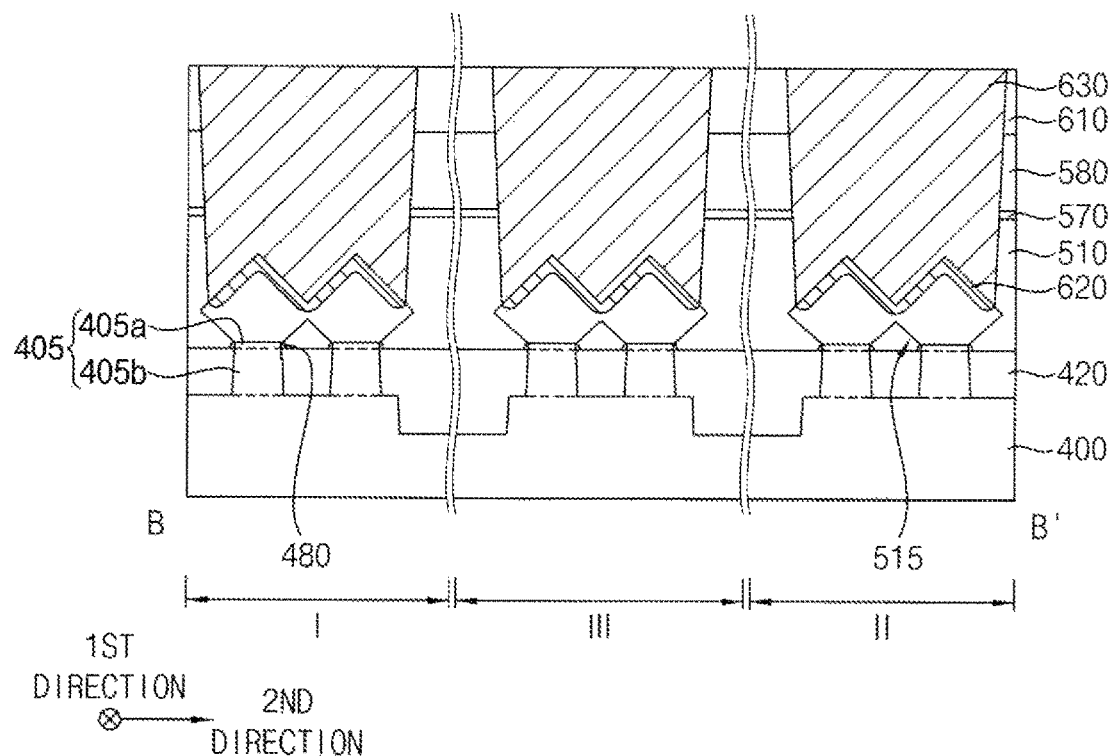
Figure 29:
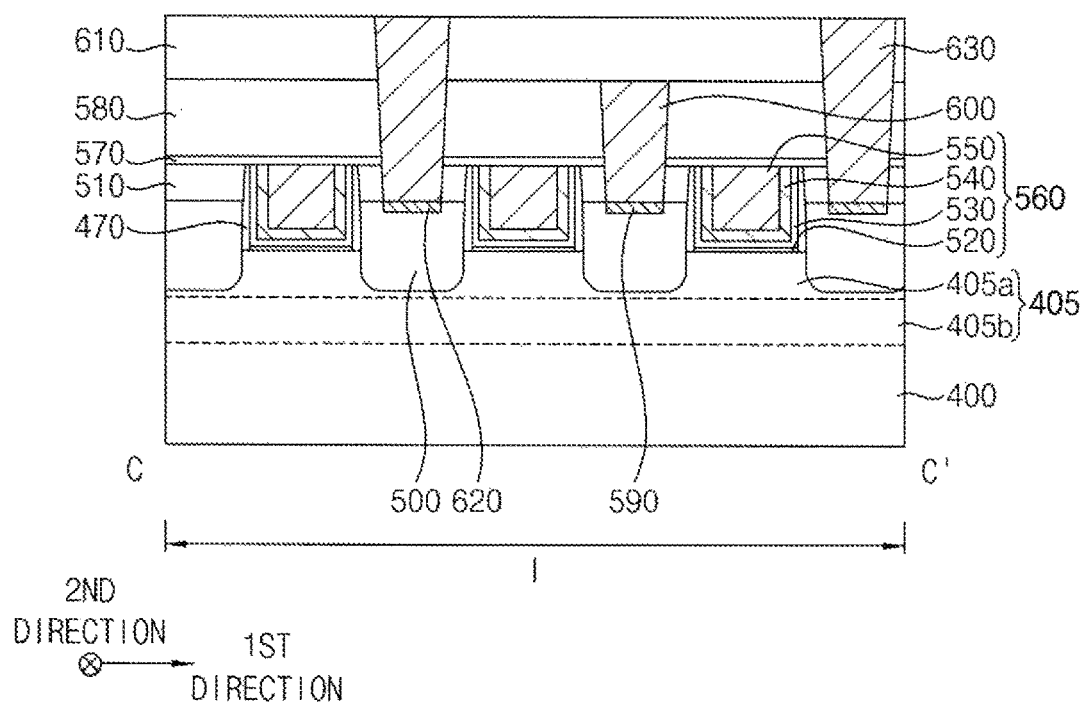

Referring to FIGS. 28 and 29, a capping layer 570 and a first insulating interlayer 580 may be sequentially formed on the insulation layer 510, the gate structure 560, and the gate spacer 470, and a source line 600 may be formed through the insulation layer 510, the capping layer 570, and the first insulating interlayer 580 to contact an upper surface of the source/drain layer 500 in the first and second regions I and II of the substrate 400.

The source line 600 may be formed by following processes.

A second opening may be formed through the insulation layer 510, the capping layer 570, and the first insulating interlayer 580 to expose the upper surface of the source/drain layer 500 in the first and second regions I and II of the substrate 400, a first metal layer may be formed on the exposed upper surface of the source/drain layer 500, a sidewall of the second opening, and an upper surface of the first insulating interlayer 580, and thermal treatment may be performed on the first metal layer to form a first metal silicide pattern 590 on the source/drain layer 500.

A second barrier layer may be formed on an upper surface of the first metal silicide pattern 590, the sidewall of the second opening, and the upper surface of the first insulating interlayer 580, a second conductive layer may be formed on the second barrier layer to fill the second opening, and the second conductive layer and the second barrier layer may be planarized until the upper surface of the first insulating interlayer 580 may be exposed.

Thus, the source line 600 including the second barrier pattern and the second conductive pattern sequentially stacked on the first metal silicide pattern 590 may be formed to fill the second opening.

In example embodiments, the source line 600 may extend in the second direction to a given length, and a plurality of source lines 600 may be formed in the first direction.

A second insulating interlayer 610 may be formed on the first insulating interlayer 580 and the source line 600, a third opening may be formed through the insulation layer 510, the capping layer 570, the first insulating interlayer 580, and the second insulating interlayer 610 to expose an upper surface of the source/drain layer 500 in the first to third regions I, II, and III of the substrate 400, a second metal layer may be formed on the exposed upper surface of the source/drain layer 500, a sidewall of the third opening, and an upper surface of the second insulating interlayer 610, and thermal treatment may be performed on the second metal layer to form a second metal silicide pattern 620 on the source/drain layer 500.

A third barrier layer may be formed on an upper surface of the second metal silicide pattern 620, the sidewall of the third opening, and the upper surface of the second insulating interlayer 610, a third conductive layer may be formed on the third barrier layer to fill the third opening, and the third conductive layer and the third barrier layer may be planarized until the upper surface of the second insulating interlayer 610 may be exposed.

Thus, a lower contact plug 630 including the second barrier pattern and the second conductive pattern sequentially stacked on the first metal silicide pattern 620 may be formed to fill the third opening.

In example embodiments, a plurality of lower contact plugs 630 may be formed on each of the first to third regions I, II, and III of the substrate 400.

Figure 30:
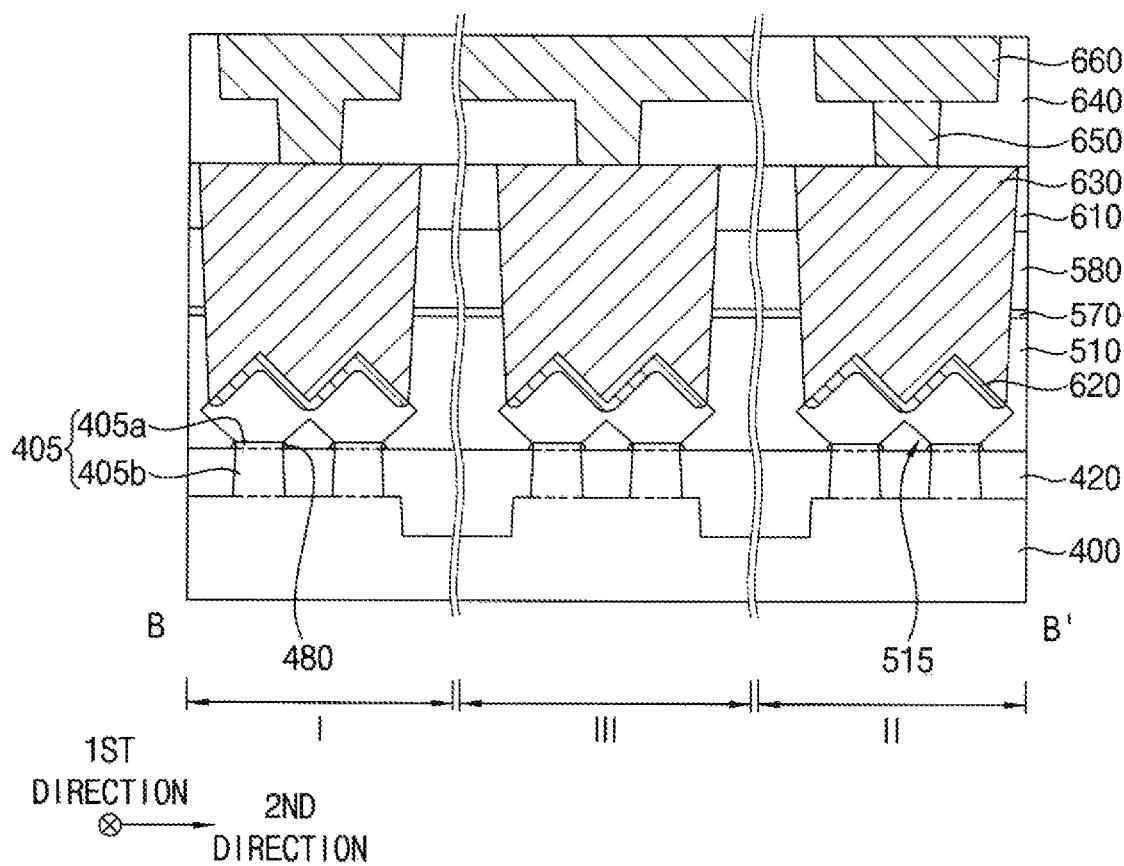
Figure 31:
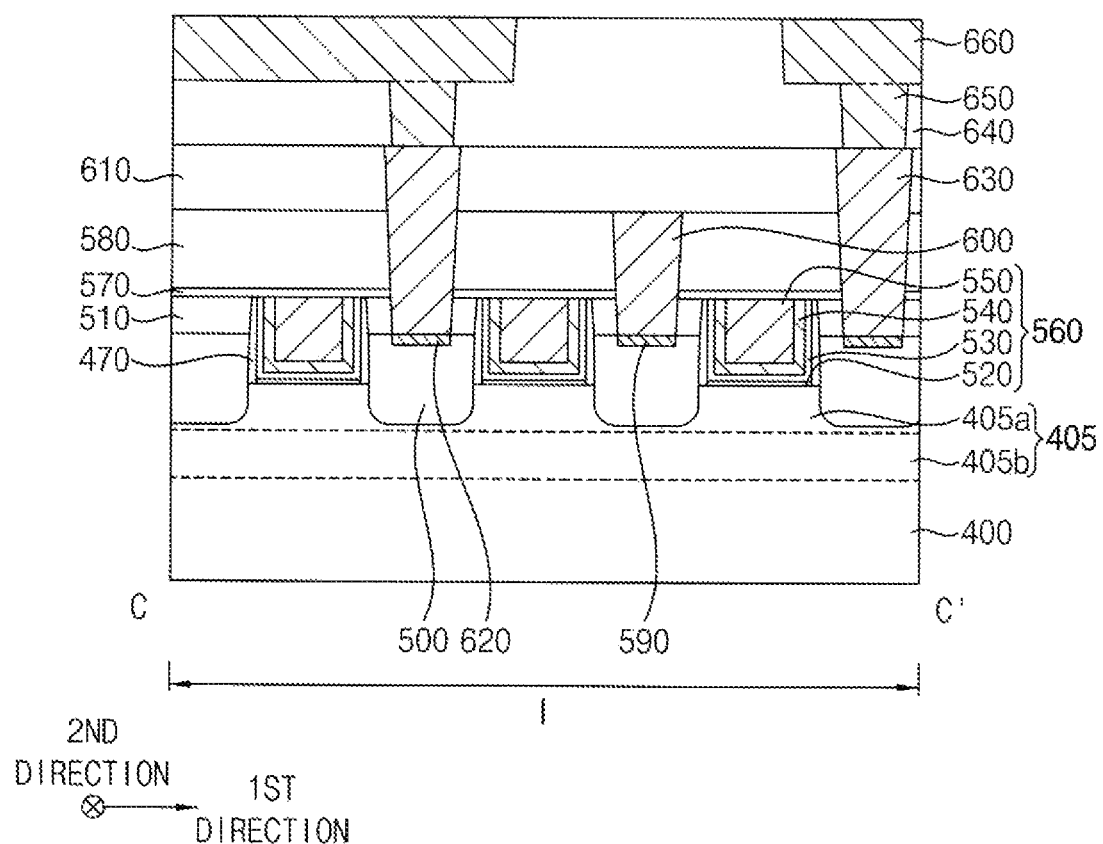

Referring to FIGS. 30 and 31, a third insulating interlayer 640 may be formed on the second insulating interlayer 610 and the lower contact plug 630, and a first conductive line 660 extending through an upper portion of the third insulating interlayer 640 and a first via 650 extending through a lower portion of the third insulating interlayer 640 may be formed.

In example embodiments, the first conductive line 660 and the first via 650 may be simultaneously formed by a dual damascene process. Thus, each of the first conductive line 660 and the first via 650 may be formed to include a fourth conductive pattern and a fourth barrier pattern covering a bottom and a sidewall of the fourth conductive pattern.

Alternatively, the first conductive line 660 and the first via 650 may be independently formed by a single damascene process.

In example embodiments, the first conductive line 660 may extend in a direction, and a plurality of first conductive lines 660 may be formed to be spaced apart from each other. In example embodiments, the first via 650 may be formed beneath the first conductive line 660 to contact an upper surface of the lower contact plug 630.

Figure 32:
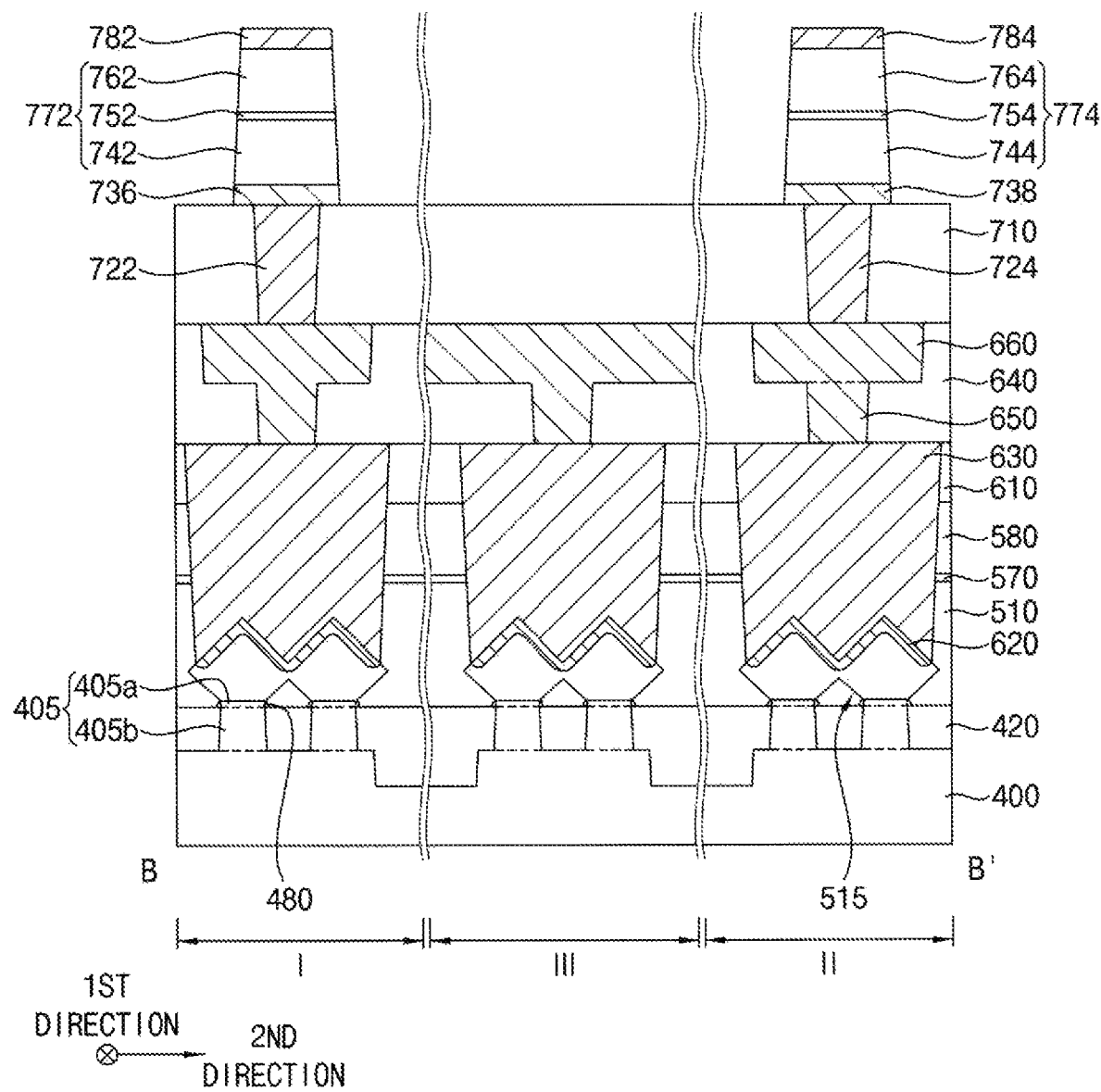
Figure 33:
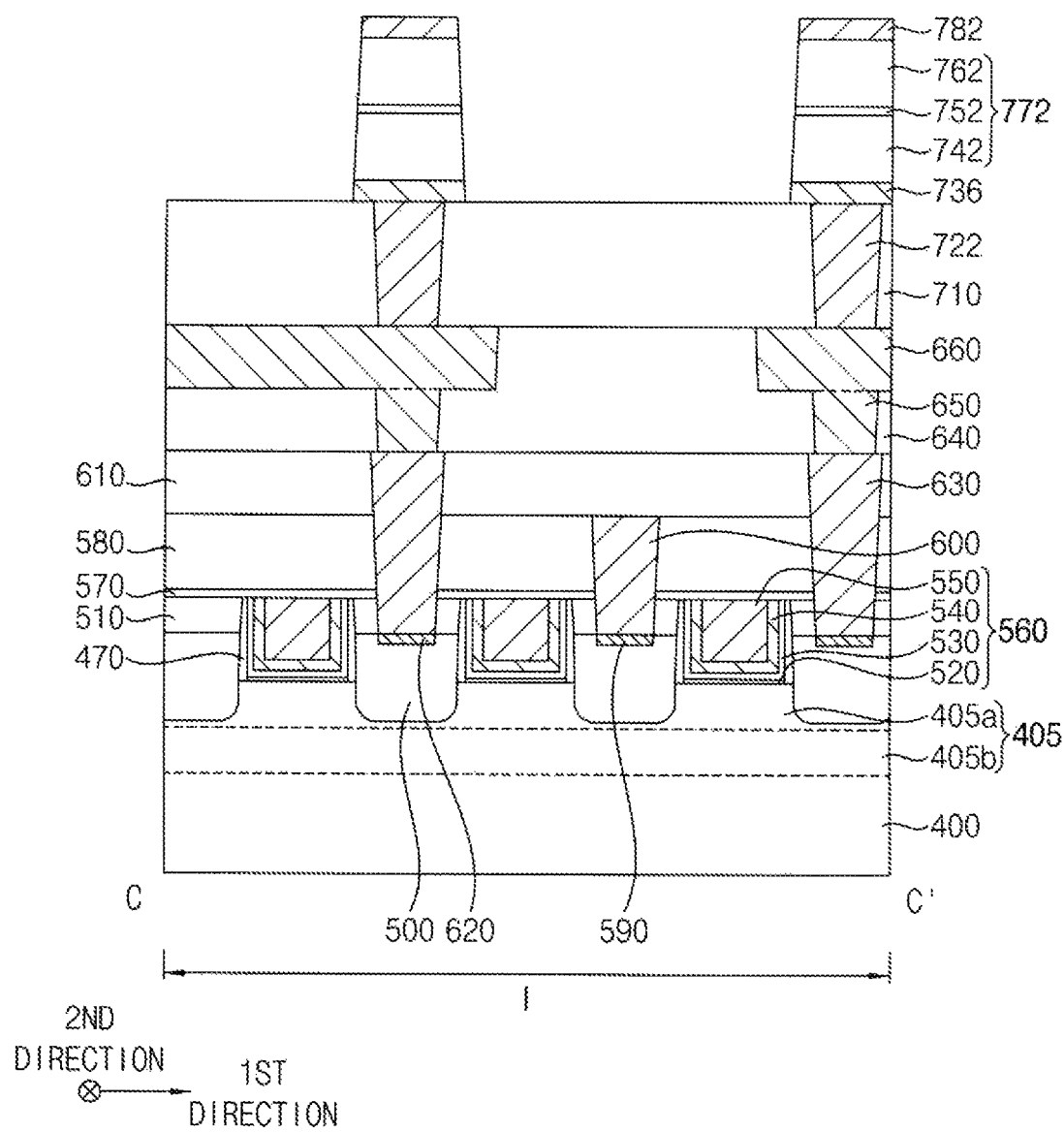

Referring to FIGS. 32 and 33, processes substantially the same as or similar to those illustrated with reference to FIGS. 1 to 4 may be performed.

Thus, a fourth insulating interlayer 710 may be formed on the third insulating interlayer 640 and the first conductive line 660, and first and second contact plugs 722 and 724 may be formed through the fourth insulating interlayer 710 to contact the first conductive lines 660 on the first and second regions I and II of the substrate 400.

A first lower electrode 736, a first MTJ structure 772, and a first upper electrode 782 may be sequentially stacked on the first contact plug 722, and a second lower electrode 738, a second MTJ structure 774, and a second upper electrode 784 may be sequentially stacked on the second contact plug 724.

The first MTJ structure 772 may include a first fixed structure 742, a first tunnel barrier pattern 752, and a first free layer pattern 762 sequentially stacked, and the second MTJ structure 774 may include a second fixed structure 744, a second tunnel barrier pattern 754, and a second free layer pattern 764 sequentially stacked.

In an embodiment, the first and second MTJ structures 772 and 774 on the respective first and second regions I and II of the substrate 400 may have different characteristics, e.g., different switching current densities, data retentions, etc., due to the respective underlying first and second lower electrodes 736 and 738. Thus, the MRAM device including the first and second MTJ structures 772 and 774 may be easily fabricated to have different characteristics in different regions, for example, a high data retention in one region, and a lower consumption power and a high operation speed in another region.

Figure 34:
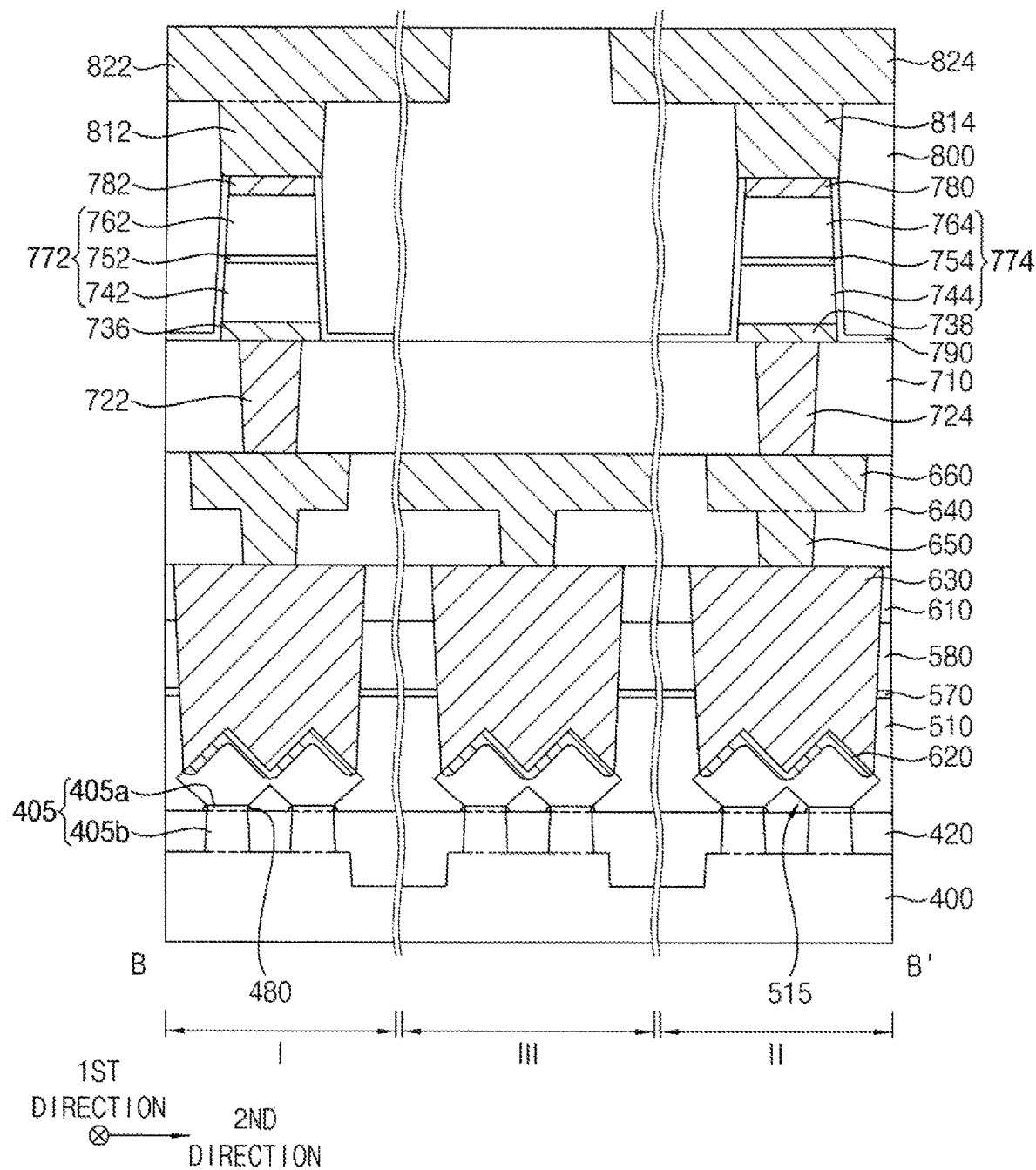
Figure 35:
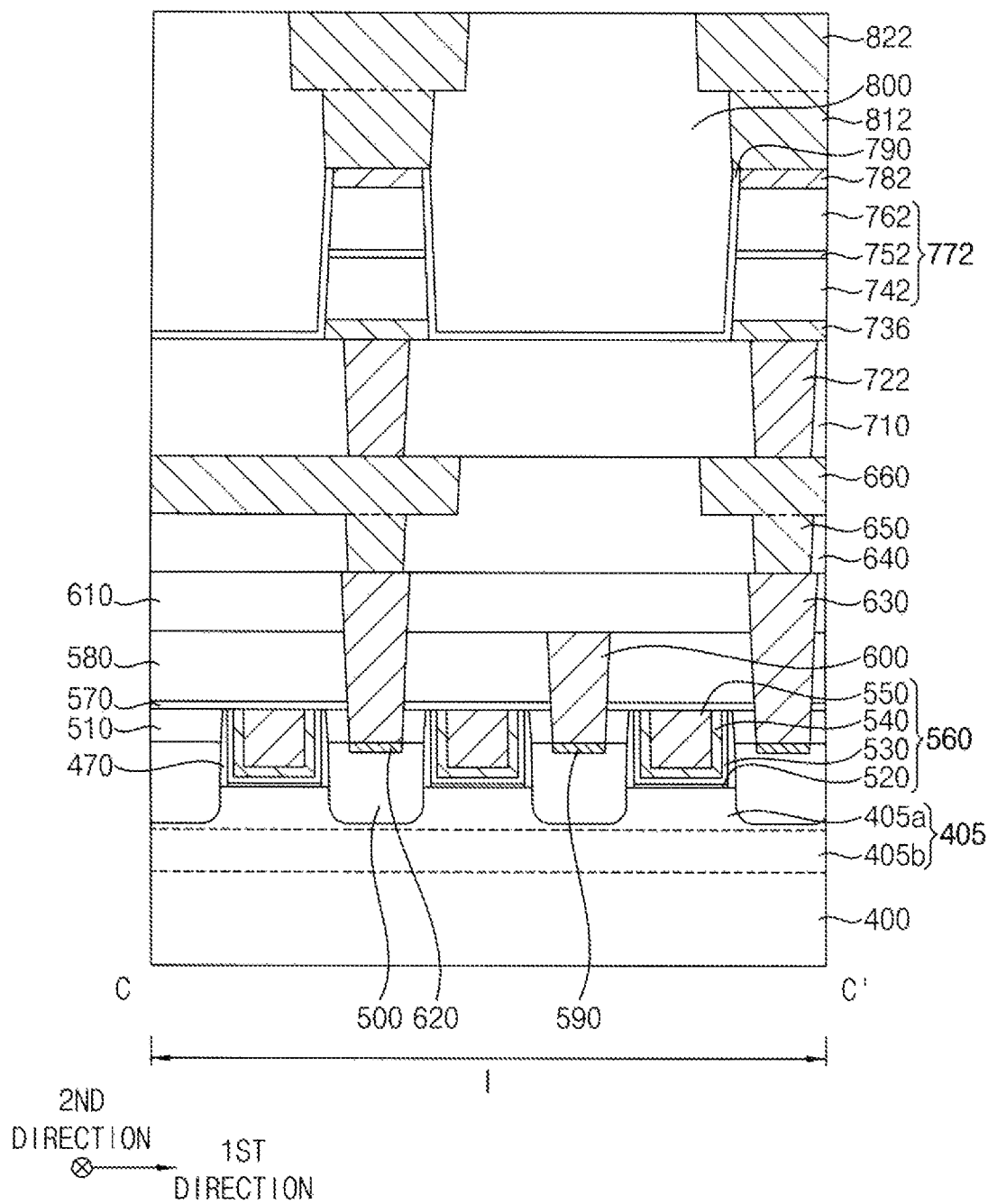

Referring to FIGS. 34 and 35, a protection layer 790 may be formed on the fourth insulating interlayer 710 to cover the first and second lower electrodes 736 and 738, the first and second MTJ structures 772 and 774, and the first and second upper electrodes 782 and 784, and a fifth insulating interlayer 800 may be formed on the protection layer 790.

A second via 812 and a second conductive line 822 extending through an upper portion of the fifth insulating interlayer 800 and contacting an upper surface of the first upper electrode 782 may be formed, and a third via 814 and a third conductive line 824 extending through an upper portion of the fifth insulating interlayer 800 and contacting an upper surface of the second upper electrode 784 may be formed.

In example embodiments, each of the second and third conductive lines 822 and 824 may extend in the second direction, and may serve as a bit line of the MRAM device.

Even though, in the drawings, the first MTJ structure 772 is formed between the first conductive line 660 and the second conductive line 822, and the second MTJ structure 774 is formed between the first conductive line 660 and the third conductive line 824, embodiments are not limited thereto. That is, the MRAM device may include a plurality of conductive lines disposed in a vertical direction, and the first and second MTJ structures 772 and 774 may be formed between any neighboring ones of the plurality conductive lines in the vertical direction.

Figure 36:
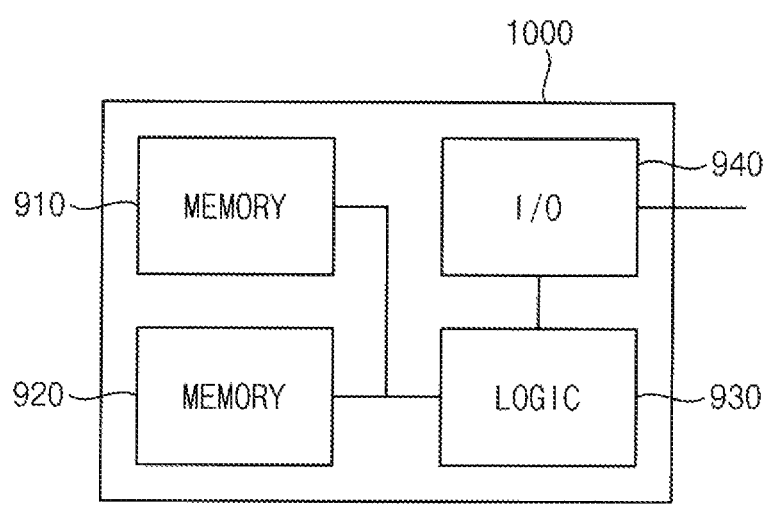

FIG. 36 illustrates a method of manufacturing a semiconductor chip in accordance with example embodiments.

Referring to FIG. 36, a semiconductor chip 1000 may include first and second memory blocks 910 and 920, a logic device 930, and an input/output (I/O) device 940.

Each of the first and second memory blocks 910 and 920 may include memory cells in a memory cell region, and peripheral circuits in a peripheral circuit region. In example embodiments, each of the first and second memory blocks 910 and 920 may include an MRAM device. The first and second memory blocks 910 and 920 may be distinguished or spaced apart from each other, and may include first and second MTJ structures, respectively.

In example embodiments, the first and second MTJ structures may have different characteristics, e.g., different switching current densities, data retentions, consumption powers, operation speeds, etc., and thus the MRAM device including the first and second MTJ structures may have different characteristics in different regions. For example, the MRAM device of the first memory block 910 may have a relatively high switching current density and/or a relatively high data retention, and the MRAM device of the second memory block 920 may have a relatively low consumption power and/or a relatively high operation speed.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the embodiments. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   first and second gate structures on a substrate;
   first and second source/drain layers on portions of the substrate adjacent to the first and second gate structures, respectively;
   a first contact plug electrically connected to the first source/drain layer, and a second contact plug electrically connected to the second source/drain layer;
   a first lower electrode on the first contact plug, and a second lower electrode on the second contact plug, the first and second lower electrodes being separated from each other and having different materials from each other;
   a first MTJ structure on the first lower electrode, and a second MTJ structure on the second lower electrode;
   a first upper electrode on the first MTJ structures, and a second upper electrode on the second MTJ structures;
   first and second conductive lines electrically connected to the first and second upper electrodes, respectively; and
   a protection layer covering sidewalls of the first and second lower electrodes, the first and second MTJ structures, and the first and second upper electrodes.

2. The semiconductor device as claimed in claim 1, further comprising an insulating interlayer containing the first and second contact plugs therein,
   wherein the protection layer covers an upper surface of the insulating interlayer.

3. The semiconductor device as claimed in claim 1, wherein widths of lower surfaces of the first and second lower electrodes are greater than widths of upper surfaces of the first and second contact plugs, respectively.

4. The semiconductor device as claimed in claim 1, wherein widths of lower surfaces of the first and second MTJ structures are greater than widths of upper surfaces of the first and second contact plugs, respectively.

5. The semiconductor device as claimed in claim 1, wherein a first structure including the first lower electrode, the first MTJ structure and the first upper electrode sequentially stacked has a width gradually decreasing from a bottom toward a top thereof, and
   wherein a second structure including the second lower electrode, the second MTJ structure and the second upper electrode sequentially stacked has a width gradually decreasing from a bottom toward a top thereof.

6. The semiconductor device as claimed in claim 1, further comprising a source line electrically connected to one of the first and second source/drain layers.

7. The semiconductor device as claimed in claim 6, further comprising:
   first and second lower contact plugs on the first and second source/drain layers, respectively, the first and second lower contact plugs being disposed under the first and second contact plugs, respectively, to be electrically connected thereto,
   wherein upper surfaces of the first and second lower contact plugs are higher than an upper surface of the source line.

8. The semiconductor device as claimed in claim 1, wherein each of the first and second lower electrodes includes a metal nitride or a metal.

9. The semiconductor device as claimed in claim 8, wherein the first lower electrode includes titanium nitride, and the second lower electrode includes tantalum nitride or tungsten nitride.

10. The semiconductor device as claimed in claim 8, wherein the first lower electrode includes a metal, and the second lower electrode includes a metal nitride.

11. The semiconductor device as claimed in claim 10, wherein each of the first and second lower electrodes includes metal patterns and/or metal nitride patterns sequentially stacked.

12. The semiconductor device as claimed in claim 11, wherein the first lower electrode includes first, second, and third patterns sequentially stacked, and the second lower electrode includes fourth, fifth, and sixth patterns sequentially stacked, the fourth to sixth patterns including materials substantially the same as those of the first to third patterns, respectively,
   wherein the first and second lower electrodes have substantially the same thickness, and
   wherein at least one of the first to third patterns has a thickness different from that of corresponding one of the fourth to sixth patterns.

13. A magnetoresistive random access memory (MRAM) device, comprising:
   first and second lower electrodes in first and second regions, respectively, of a substrate, the first and second lower electrodes being separated from each other and having different crystallinities from each other;
   first and second MTJ structures on the first and second lower electrodes, respectively; and
   first and second upper electrodes on the first and second MTJ structures, respectively.

14. The MRAM device as claimed in claim 13, wherein the first and second MTJ structures have different crystallinities from each other.

15. The MRAM device as claimed in claim 13, wherein the first and second lower electrodes include different materials from each other.

16. The semiconductor device as claimed in claim 15, wherein each of the first and second lower electrodes includes a metal nitride or a metal.

17. The semiconductor device as claimed in claim 15, wherein the first lower electrode includes titanium nitride, and the second lower electrode includes tantalum nitride or tungsten nitride.

18. The MRAM device as claimed in claim 13, wherein the first and second lower electrodes include substantially the same material as each other.

19. A semiconductor chip, comprising:
- first and second lower electrodes on first and second memory cell regions, respectively, of a substrate, the substrate including first and second memory block regions, a logic region, and an input/output (I/O) region, the first memory block region including the first memory cell region and a first peripheral circuit region, the second memory block region including the second memory cell region and a second peripheral circuit region, and the first and second lower electrodes being separated from each other and having different crystallinities from each other;
- first and second MTJ structures on the first and second lower electrodes, respectively; and
- first and second upper electrodes on the first and second MTJ structures, respectively.

20. The semiconductor chip as claimed in claim 19, wherein the first and second lower electrodes include different materials from each other.

* * * * *